(12) United States Patent
Park

(10) Patent No.: US 12,334,471 B2
(45) Date of Patent: Jun. 17, 2025

(54) SEMICONDUCTOR DEVICES AND MANUFACTURING METHODS OF THE SAME

(71) Applicant: Samsung Electronics Co., Ltd., Suwon-si (KR)

(72) Inventor: Hyun Mog Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 637 days.

(21) Appl. No.: 17/510,594

(22) Filed: Oct. 26, 2021

(65) Prior Publication Data

US 2022/0045035 A1 Feb. 10, 2022

Related U.S. Application Data

(63) Continuation of application No. 16/397,556, filed on Apr. 29, 2019, now Pat. No. 11,171,116.

(30) Foreign Application Priority Data

Oct. 1, 2018 (KR) .......................... 10-2018-0116804

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/5226* (2013.01); *H01L 23/528* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 8,476,708 B2 7/2013 Fukuzumi et al.
8,891,306 B2 11/2014 Aritome
(Continued)

FOREIGN PATENT DOCUMENTS

CN 108028223 A 5/2018
JP 2011-204829 A 10/2011
(Continued)

*Primary Examiner* — Younes Boulghassoul
*Assistant Examiner* — Quinton A Brasfield
(74) *Attorney, Agent, or Firm* — Muir Patent Law, PLLC

(57) ABSTRACT

A semiconductor device includes a first substrate structure and a second substrate structure. The first substrate structure includes a base substrate, circuit elements disposed on the base substrate, a first substrate disposed on the circuit elements, first memory cells disposed on the first substrate and electrically connected to the circuit elements, first bit lines disposed on the first memory cells and connected to the first memory cells, and first bonding pads disposed on the first bit lines to be connected to the first bit lines, respectively. The second substrate structure is connected to the first substrate structure on the first substrate structure, and includes a second substrate, second memory cells disposed on the second substrate, second bit lines disposed on the second memory cells and connected to the second memory cells, and second bonding pads disposed on the second bit lines to be connected to the second bit lines, respectively. The first substrate structure and the second substrate structure are connected to each other by bonding the first bonding pads to the second bonding pads, and the first bonding pads and second bonding pads are vertically between the first bit lines and the second bit lines, without the first substrate or second substrate disposed vertically between the first bit lines and the second bit lines.

8 Claims, 26 Drawing Sheets

(51) Int. Cl.
| | | |
|---|---|---|
| *H01L 23/522* | (2006.01) | |
| *H01L 23/528* | (2006.01) | |
| *H01L 25/00* | (2006.01) | |
| *H01L 25/18* | (2023.01) | |
| *H10B 41/27* | (2023.01) | |
| *H10B 41/30* | (2023.01) | |
| *H10B 41/40* | (2023.01) | |
| *H10B 43/27* | (2023.01) | |
| *H10B 43/30* | (2023.01) | |
| *H10B 43/40* | (2023.01) | |

(52) U.S. Cl.
CPC .............. *H01L 24/08* (2013.01); *H01L 24/89* (2013.01); *H01L 25/18* (2013.01); *H01L 25/50* (2013.01); *H10B 41/27* (2023.02); *H10B 41/30* (2023.02); *H10B 41/40* (2023.02); *H10B 43/27* (2023.02); *H10B 43/30* (2023.02); *H10B 43/40* (2023.02); *H01L 24/05* (2013.01); *H01L 2224/0557* (2013.01); *H01L 2224/08145* (2013.01); *H01L 2224/80001* (2013.01); *H01L 2225/06541* (2013.01); *H01L 2225/06565* (2013.01)

(58) Field of Classification Search
CPC .. H01L 25/0756; H01L 25/112; H01L 25/117; H01L 2224/08145; H01L 27/0688; H01L 23/528–5283; H01L 21/76877–76883; H01L 23/49827; H01L 23/5384; H01L 23/481; H01L 29/4175; H01L 2225/06541–06544; H01L 2225/06548; H01L 21/76898; H01L 23/522; H01L 21/8221; H01L 25/50; H01L 25/18; H10B 43/40; H10B 41/40; H10B 41/27; H10B 43/27; H10B 41/30; H10B 41/35; H10B 41/41; H10B 41/50; H10B 43/30; H10B 43/35; H10B 43/50

See application file for complete search history.

(56) References Cited

U.S. PATENT DOCUMENTS

| | | | |
|---|---|---|---|
| 9,070,446 | B1 | 6/2015 | Aritome |
| 9,502,471 | B1 | 11/2016 | Lu et al. |
| 9,558,945 | B2 | 1/2017 | Fukuzumi et al. |
| 9,876,031 | B1* | 1/2018 | Shimizu .............. H01L 23/5226 |
| 10,074,667 | B1* | 9/2018 | Higashi .............. H01L 25/0657 |
| 10,283,493 | B1* | 5/2019 | Nishida ............... H01L 24/80 |
| 10,665,581 | B1* | 5/2020 | Zhou ................... H10D 88/00 |
| 2010/0117143 | A1 | 5/2010 | Lee et al. |
| 2010/0276572 | A1 | 11/2010 | Iwabuchi et al. |
| 2015/0003158 | A1 | 1/2015 | Aritome |
| 2015/0060967 | A1 | 3/2015 | Yokoyama et al. |
| 2015/0333056 | A1 | 11/2015 | Du et al. |
| 2016/0233264 | A1 | 8/2016 | Kagawa et al. |
| 2017/0103994 | A1 | 4/2017 | Fukuzumi et al. |
| 2017/0230598 | A1 | 8/2017 | Takayanagi et al. |
| 2018/0277497 | A1 | 9/2018 | Matsuo |
| 2019/0013326 | A1 | 1/2019 | Hua et al. |
| 2019/0043836 | A1* | 2/2019 | Fastow .............. H01L 25/0657 |
| 2019/0088589 | A1* | 3/2019 | Zhu ...................... H10B 43/40 |
| 2020/0066703 | A1 | 2/2020 | Kim et al. |
| 2020/0098748 | A1* | 3/2020 | Xiao ....................... G11C 5/06 |
| 2020/0357784 | A1 | 11/2020 | Park |
| 2020/0365560 | A1 | 11/2020 | Kanamori et al. |
| 2021/0111137 | A1 | 4/2021 | Chen et al. |

FOREIGN PATENT DOCUMENTS

| | | |
|---|---|---|
| JP | 2015065407 A | 4/2015 |
| JP | 6123990 A | 5/2017 |
| KR | 1020080019652 A | 3/2008 |
| KR | 10-1040154 B1 | 6/2011 |
| WO | 2006129762 A1 | 12/2006 |
| WO | 2016009942 A1 | 1/2016 |

* cited by examiner

SEMICONDUCTOR DEVICES AND MANUFACTURING METHODS OF THE SAME

CROSS-REFERENCE TO RELATED APPLICATION(S)

This application is a continuation application of U.S. patent application Ser. No. 16/397,556, filed Apr. 29, 2019, which claims priority to Korean Patent Application No. 10-2018-0116804 filed on Oct. 1, 2018 in the Korean Intellectual Property Office, the disclosure of each of which is incorporated herein by reference in its entirety.

BACKGROUND

1. Field

The present inventive concept relates to a semiconductor device and a method for manufacturing the same.

2. Description of Related Art

Semiconductor devices are increasingly required to process high-capacity data while being gradually reduced in volume. Correspondingly, there is a need to increase a degree of integration of semiconductor elements forming such semiconductor devices. Resultantly, as one method of increasing a degree of integration of semiconductor elements, a semiconductor device having a vertical transistor structure, in place of a conventional planar transistor structure, has been proposed.

SUMMARY

An aspect of the present inventive concept is to provide a semiconductor device having improved degrees of integration and reliability and a method for manufacturing the same.

According to an aspect of the present inventive concept, a semiconductor device includes a first substrate structure and a second substrate structure. The first substrate structure includes a first substrate, first gate electrodes stacked and spaced apart from each other in a direction perpendicular to a first surface of the first substrate, first channels extending perpendicular to the first substrate while passing through the first gate electrodes, first bit lines connected to the first channels, and first bonding pads disposed on the first bit lines to be electrically connected to the first bit lines, wherein, in the direction perpendicular to the first surface of the first substrate, the first bit lines are disposed between the first channels and the first bonding pads, and the first channels extend between the first substrate and the first bit lines. The second substrate structure is connected to the first substrate structure on the first substrate structure, and includes a second substrate, second gate electrodes stacked and spaced apart from each other in a direction perpendicular to a first surface of the second substrate that faces the first surface of the first substrate, second channels extending perpendicular to the second substrate while passing through the second gate electrodes, second bit lines connected to the second channels, and second bonding pads disposed on the second bit lines to be electrically connected to the second bit lines, wherein, in the direction perpendicular to the first surface of the second substrate, the second bit lines are disposed between the second channels and the second bonding pads, and the second channels extend between the second substrate and the second bit lines. The first substrate structure and the second substrate structure are bonded together by the first bonding pads and the second bonding pads and connected to each other, and the first bit lines are electrically connected to the second bit lines, respectively, through the first bonding pads and the second bonding pads.

According to an aspect of the present inventive concept, which may be the same embodiment as the aforementioned aspect or a different embodiment, the first substrate structure includes a first substrate, first gate electrodes stacked and spaced apart from each other in a direction perpendicular to a first surface of the first substrate and extended by different lengths in one direction to provide first contact regions, first channels extending perpendicular to the first substrate while passing through the first gate electrodes, first cell contact plugs connected to the first gate electrodes in the first contact regions and extending perpendicular to the first surface of the first substrate, first bit lines connected to the first channels, and first bonding pads disposed at a first surface of the first substrate structure, wherein the first bit lines are disposed between the first channels and the first bonding pads in a direction perpendicular to the first surface of the first substrate. The second substrate structure may be connected to the first substrate structure on the first substrate structure, and may include a second substrate, second gate electrodes stacked and spaced apart from each other in a direction perpendicular to a first surface of the second substrate and extended by different lengths in one direction to provide second contact regions, second channels extending perpendicular to the second substrate while passing through the second gate electrodes, second cell contact plugs connected to the second gate electrodes in the second contact regions and extending perpendicular to the first surface of the second substrate, second bit lines connected to the second channels, and second bonding pads bonded to the first bonding pads and disposed at a first surface of the second substrate structure. The first surface of the first substrate faces the first surface of the second substrate, and the first surface of the first substrate structure faces the first surface of the second substrate structure, and the first bit lines are electrically connected to the second bit lines through respective bonding pads of the first bonding pads and the second bonding pads, and some of the first cell contact plugs are respectively electrically connected to the second cell contact plugs through respective bonding pads of the first bonding pads and the second bonding pads.

According to an aspect of the present inventive concept, which may be the same embodiment as the aforementioned aspects, or a different embodiment, the first substrate structure includes a base substrate, circuit elements disposed on the base substrate, a first substrate disposed on the circuit elements, first memory cells disposed on the first substrate and electrically connected to the circuit elements, first bit lines disposed on the first memory cells and connected to the first memory cells, and first bonding pads disposed on the first bit lines to be connected to the first bit lines, respectively. The second substrate structure is connected to the first substrate structure on the first substrate structure, and includes a second substrate, second memory cells disposed on the second substrate, second bit lines disposed on the second memory cells and connected to the second memory cells, and second bonding pads disposed on the second bit lines to be connected to the second bit lines, respectively. The first substrate structure and the second substrate structure are connected to each other by bonding the first bonding pads to the second bonding pads, and the first bonding pads and second bonding pads are vertically between the first bit lines and the second bit lines, without the first substrate or second substrate disposed vertically between the first bit lines and the second bit lines.

According to an aspect of the present inventive concept, a method for manufacturing a semiconductor device includes: forming a first substrate structure by forming first gate electrodes stacked and spaced apart from each other in a direction perpendicular to a first surface of a first substrate, first channels extending perpendicular to the first substrate while passing through the first gate electrodes, first bit lines connected to the first channels, and first bonding pads disposed on the first bit lines to be electrically connected to the first bit lines, respectively, on the first substrate; forming a second substrate structure by forming second gate electrodes stacked and spaced apart from each other in a direction perpendicular to a first surface of a second substrate, second channels extending perpendicular to the second substrate while passing through the second gate electrodes, second bit lines connected to the second channels, and second bonding pads disposed on the second bit lines to be electrically connected to the second bit lines, respectively, on the second substrate; forming a third substrate structure by forming circuit elements, through contact plugs passing through the third substrate to a predetermined depth, and third bonding pads disposed on the circuit elements, on a first surface of the third substrate; bonding the third substrate structure to the first substrate structure by bonding the first bonding pads to the third bonding pads; exposing first ends of the through contact plugs by removing a portion of the third substrate from a second surface of the third substrate, opposite the first surface; forming fourth bonding pads on the through contact plugs, exposed through the second surface of the third substrate; and bonding the second substrate structure to the third substrate structure by bonding the second bonding pads to the fourth bonding pads.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
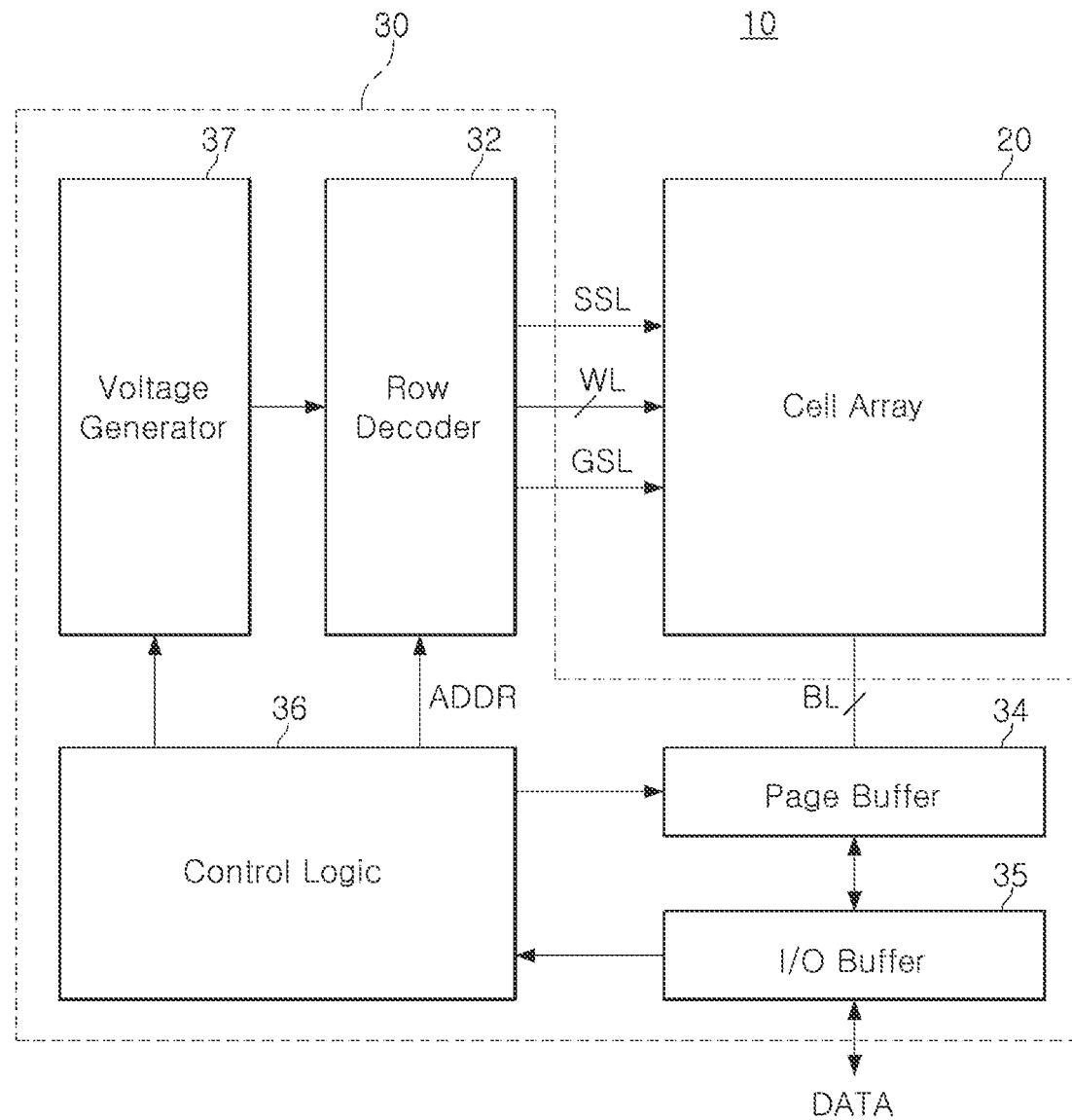
FIG. 1 is a schematic block diagram of a semiconductor device according to example embodiments.

Hereinafter, the example embodiments of the present disclosure will be described in detail with reference to the attached drawings. In the following description, terms such as 'upper,' 'upper portion,' 'upper surface,' 'lower,' 'lower portion,' 'lower surface,' and 'side surface,' and the like may be understood to refer to the reference to the drawings, unless otherwise indicated by reference numerals and referred to separately.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point or points of contact or connection. Other words used to describe the relationship between elements should be interpreted in a like fashion (e.g., "between" versus "directly between," "adjacent" versus "directly adjacent," etc.).

FIG. 1 is a schematic block diagram of a semiconductor device according to example embodiments.

Referring to FIG. 1, a semiconductor device 10 may include a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, word lines WL, and a ground select line GSL, and may be connected to the page buffer 34 through bit lines BL. In example embodiments, a plurality of memory cells arranged in an identical row may be connected to an identical word line WL, and a plurality of memory cells arranged in an identical column may be connected to an identical bit line BL.

The row decoder 32 may decode an address ADDR, having been input, and may thus generate and transmit driving signals of the word line WL. The row decoder 32 may provide a word line voltage, generated from the voltage generator 37, to a selected word line WL and unselected word lines WL, in response to control of the control logic 36.

The page buffer 34 is connected to the memory cell array 20 through the bit lines BL, and thus reads information stored in the memory cells. The page buffer 34 may temporarily store data to be stored in the memory cells, or may sense data, stored in the memory cell, according to a mode of operation. The page buffer 34 may include a column decoder and a sense amplifier. The column decoder may selectively activate bit lines BL of the memory cell array 20, while the sense amplifier may sense a voltage of a bit line BL, selected by the column decoder, and may thus read data, stored in a memory cell, having been selected.

The I/O buffer 35 may receive data DATA and transfer the data to the page buffer 34 during a programming operation, and may output the data DATA, transferred by the page buffer 34, externally, during a reading operation. The I/O buffer 35 may transmit an address or command, having been input, to the control logic 36.

The control logic 36 may control operations of the row decoder 32 and the page buffer 34. The control logic 36 may receive a control signal and an external voltage, transmitted from an external source, and may be operated according to a control signal, having been received. The control logic 36 may control reading, writing, and/or erasing operations in response to the control signals.

The voltage generator 37 may generate voltages, for example, a programming voltage, a reading voltage, an erasing voltage, and the like, required for an internal operation using an external voltage. The voltage, generated by the voltage generator 37, may be transferred to the memory cell array 20 through the row decoder 32.

Figure 2A:
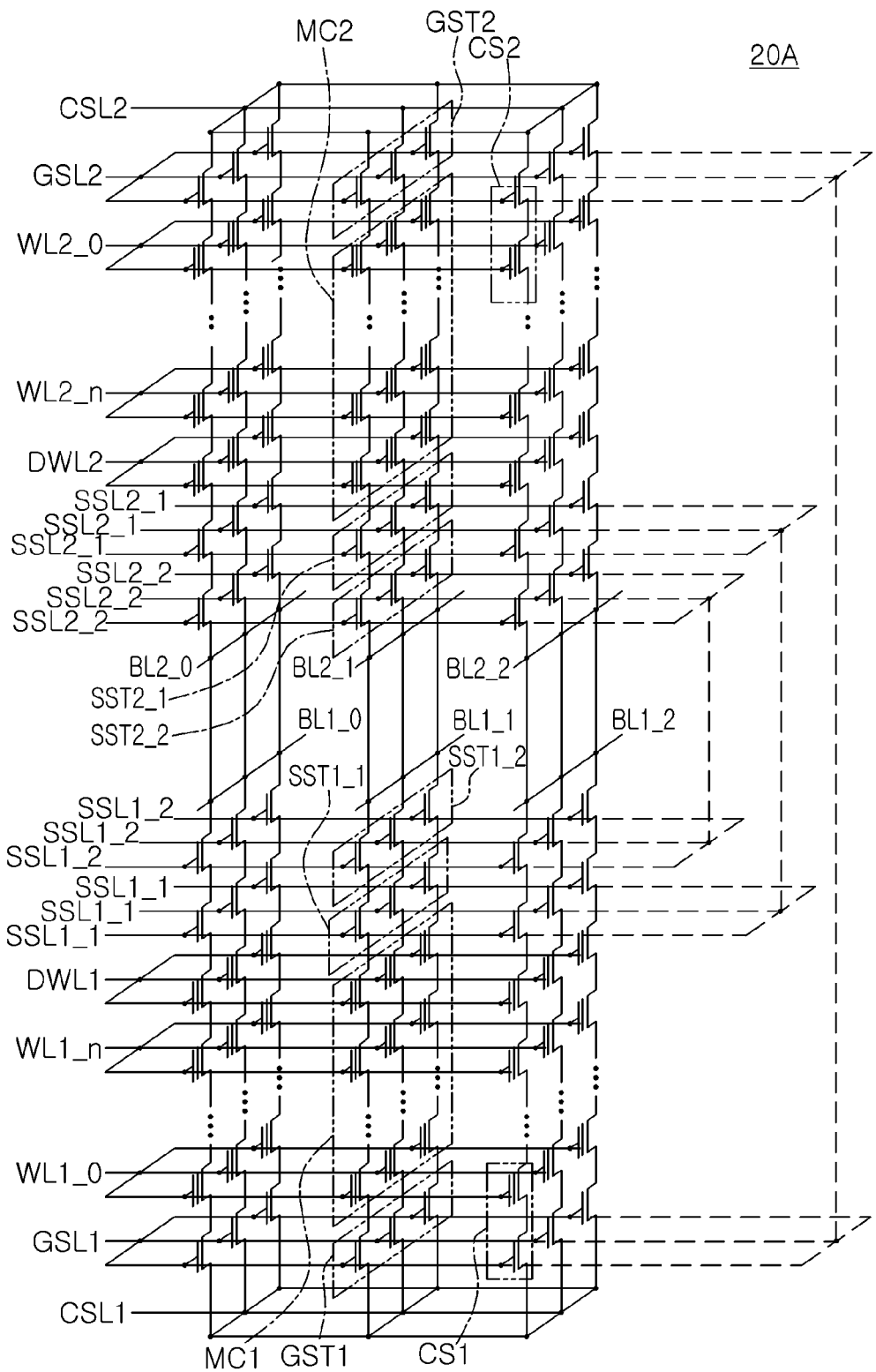
FIGS. 2A and 2B are equivalent circuit diagrams of a cell array of a semiconductor device according to example embodiments.
Figure 2B:
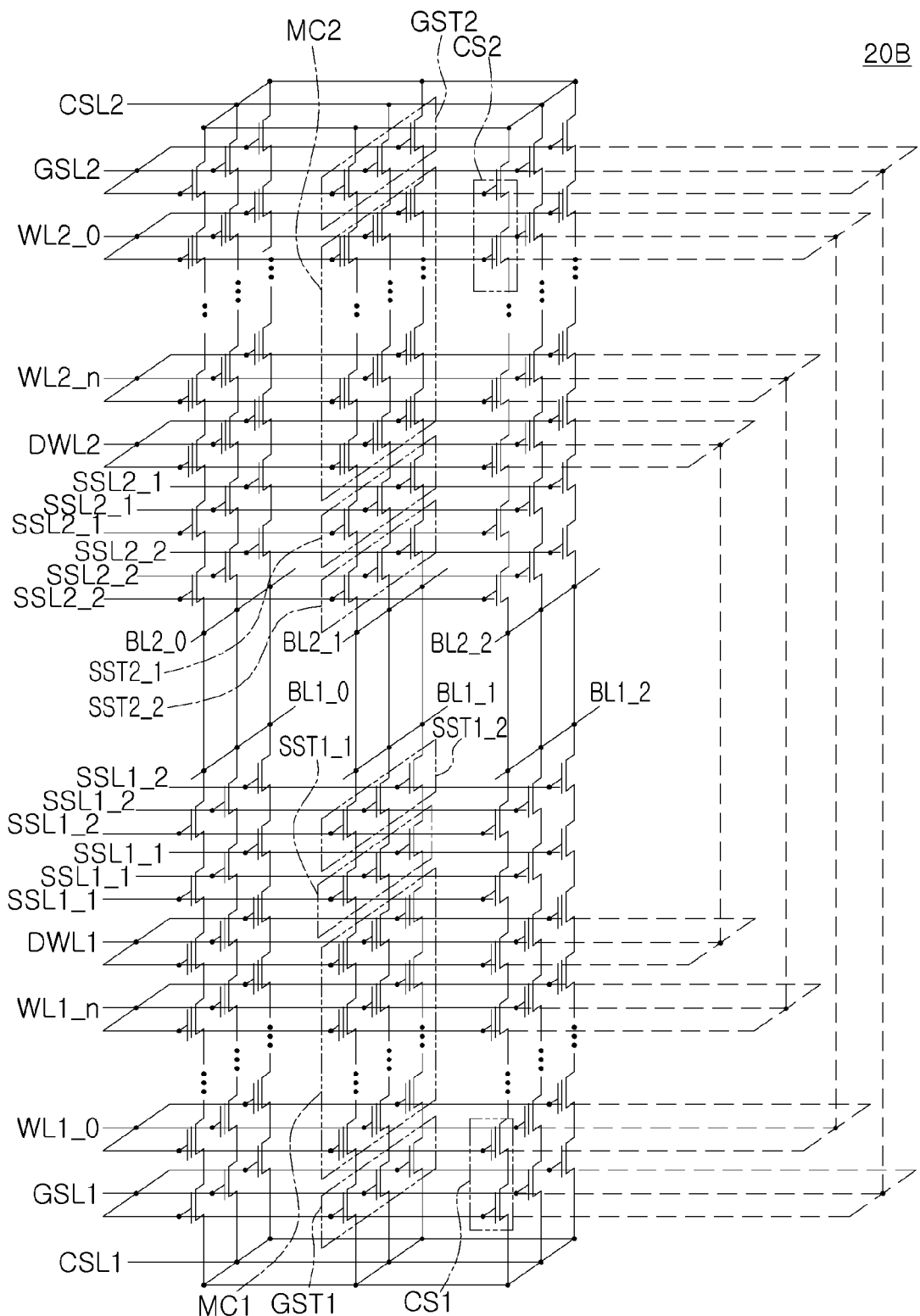

FIGS. 2A and 2B are equivalent circuit diagrams of a cell array of a semiconductor device according to example embodiments.

Referring to FIG. 2A, a memory cell array 20A may include a plurality of first memory cell strings CS1, each of which includes first memory cells MC1 connected to each other in series, and a first ground select transistor GST1 and first string select transistors SST1_1 and SST1_2 connected to both ends of the first memory cells MC1 in series. The plurality of first memory cell strings CS1 may be connected to respective first bit lines BL1_0 to BL1_2 in parallel. The plurality of first memory cell strings CS1 may be connected to a first common source line CSL1 in common. In other words, the plurality of first memory cell strings CS1 may be disposed between the plurality of first bit lines BL1_0 to BL1_2 and a single first common source line CSL1. In an example embodiment, a plurality of first common source lines CSL1 may be arranged two-dimensionally.

Moreover, the memory cell array 20A may include a plurality of second memory cell strings CS2, each of which includes second memory cells MC2 disposed on an upper portion of the first bit lines BL1_0 to BL1_2, and connected to each other in series, and a second ground select transistor GST2 and second string select transistors SST2_1 and SST2_2 connected to both ends of the second memory cells MC2 in series. The plurality of second memory cell strings CS2 may be connected to respective second bit lines BL2_0 to BL2_2 in parallel. The plurality of second memory cell strings CS2 may be connected to a second common source line CSL2 in common. As shown, the plurality of second memory cell strings CS2 may be disposed between the plurality of second bit lines BL2_0 to BL2_2 and a single second common source line CSL2.

The first bit lines BL1_0 to BL1_2 and the second bit lines BL2_0 to BL2_2, vertically disposed in the memory cell array 20A, may be electrically connected to each other. The first memory cell strings CS1 and the second memory cell strings CS2 may have substantially the same circuit structure, based on the first bit lines BL1_0 to BL1_2 and the second bit lines BL2_0 to BL2_2. In the first memory cell strings CS1 and the second memory cell strings CS2, the first string select lines SSL1_1 and SSL1_2 and the second string select lines SSL2_1 and SSL2_2 may be electrically connected to each other and may be in an equipotential state, and the first ground select line GSL1 and the second ground select line GSL2 may also be electrically connected to each other and may be in an equipotential state. However, different signals may be applied to the first word lines WL1_0 to WL1_$n$ and the second word lines WL2_0 to WL2_$n$. Thus, different types of data may be written on the first memory cells MC1 and the second memory cells MC2, respectively. Hereinafter, a description common to the first memory cell strings CS1 and the second memory cell strings CS2 will be described together without distinguishing of the first memory cell strings CS1 and the second memory cell strings CS2.

The memory cells MC1 and MC2, connected to each other in series, may be controlled by word lines WL1_0 to WL1_$n$ and WL2_0 to WL2_$n$ for selecting the memory cells MC1 and MC2. Each of the memory cells MC1 and MC2 may include a data storage element. Gate electrodes of the memory cells MC1 and MC2, arranged at substantially the same distance from the common source lines CSL1 and CSL2, may be commonly connected to one of the word lines WL1_0 to WL1_$n$ and WL2_0 to WL2_$n$ and may be in an equipotential state. Alternatively, even when the gate electrodes of the memory cells MC1 and MC2 are arranged at substantially the same distance from the common source lines CSL1 and CSL2, gate electrodes, disposed in different rows or columns, may be controlled independently.

The ground select transistors GST1 and GST2 may be controlled by the ground select lines GSL1 and GSL2, and may be connected to the common source lines CSL1 and CSL2. The string select transistors SST1_1, SST1_2, SST2_1, and SST2_2 may be controlled by the string select lines SSL1_1, SSL1_2, SSL2_1, and SSL2_2, and may be connected to the bit lines BL1_0 to BL1_2 and BL2_0 to BL2_2. FIG. 2A illustrates a structure in which a single ground select transistor GST1 and GST2 and two string select transistors SST1_1, SST1_2, SST2_1, and SST2_2 are connected to the plurality of memory cells MC1 and MC2 connected to each other in series, respectively. In a different manner, a single string select transistor, or a plurality of ground select transistors may also be connected to the memory cells. One or more dummy lines DWL1 and DWL2 or buffer lines may be further disposed between an uppermost word line WL1_$n$ and WL2_$n$, among the word lines WL1_0 to WL1_$n$ and WL2_0 to WL2_$n$, and the string select lines SSL1_1, SSL1_2, SSL2_1, and SSL2_2. In an example embodiment, one or more dummy lines DWL1 and DWL2 may also be disposed between a lowermost word line WL1_0 and WL2_0 and the ground select line GSL1 and GSL2. In the present specification, elements referred to by the term 'dummy' may have the same or a similar structure and shape to that of other components, and may only be used to refer to a component present as a pattern, without a practical function within a device (e.g., it may be connected to memory cells whose stored information is ignored by a host or controller).

When a signal is applied to the string select transistors SST1_1, SST1_2, SST2_1, and SST2_2 through the string select lines SSL1_1, SSL1_2, SSL2_1, and SSL2_2, a signal, applied through the bit lines BL1_0 to BL1_2 and BL2_0 to BL2_2, may be transmitted to the memory cells MC1 and MC2, connected to each other in series, and a data reading operation and a data writing operation may be performed. Moreover, a predetermined erasing voltage is applied through a substrate, so an erasing operation for erasing data, written on the memory cells MC1 and MC2, may be performed. In an example embodiment, the memory cell array 20A may include at least one dummy memory cell string, electrically isolated from the bit lines BL1_0 to BL1_2 and BL2_0 to BL2_2.

As can be seen in FIG. 2A, in one embodiment, the memory cell array 10A may have a bilaterally symmetric structure around a portion of the array where bit lines BL1_0 to BL1_2 and BL2_0 to BL2_2 connect to each other.

Referring to FIG. 2B, the first bit lines BL1_0 to BL1_2 and the second bit lines BL2_0 to BL2_2, vertically disposed in a memory cell array 20B, may be electrically connected to each other. In a manner similar to that illustrated in FIG. 2A, the first memory cell strings CS1 and the second memory cell strings CS2 may have substantially the same circuit structure, based on the first bit lines BL1_0 to BL1_2 and the second bit lines BL2_0 to BL2_2. However, in a manner different from that illustrated in FIG. 2A, in the first memory cell strings CS1 and the second memory cell strings CS2, the first word lines WL1_0 to WL1_$n$ and the second word lines WL2_0 to WL2_$n$ may be electrically connected to each other and may be in equipotential state. Moreover, the first ground select line GSL1 and the second ground select line GSL2 are also electrically connected to each other and may be in equipotential state. On the other hand, the first string select line SSL1_1 and SSL1_2 and the second string select line SSL2_1 and SSL2_2 may be separately controlled by applying different signals. Thus, different types of data may be written on the first memory cells MC1 and the second memory cells MC2, respectively. On the other hand, in example embodiments, the first string select line SSL1_1 and SSL1_2 and the second string select line SSL2_1 and SSL2_2 may be electrically connected to each other. In this case, the first memory cell strings CS1 and the second memory cell strings CS2 may be operated in the same manner, and data may be written and erased in the first memory cells MC1 and the second memory cells MC2 in the same manner.

Figure 3A:
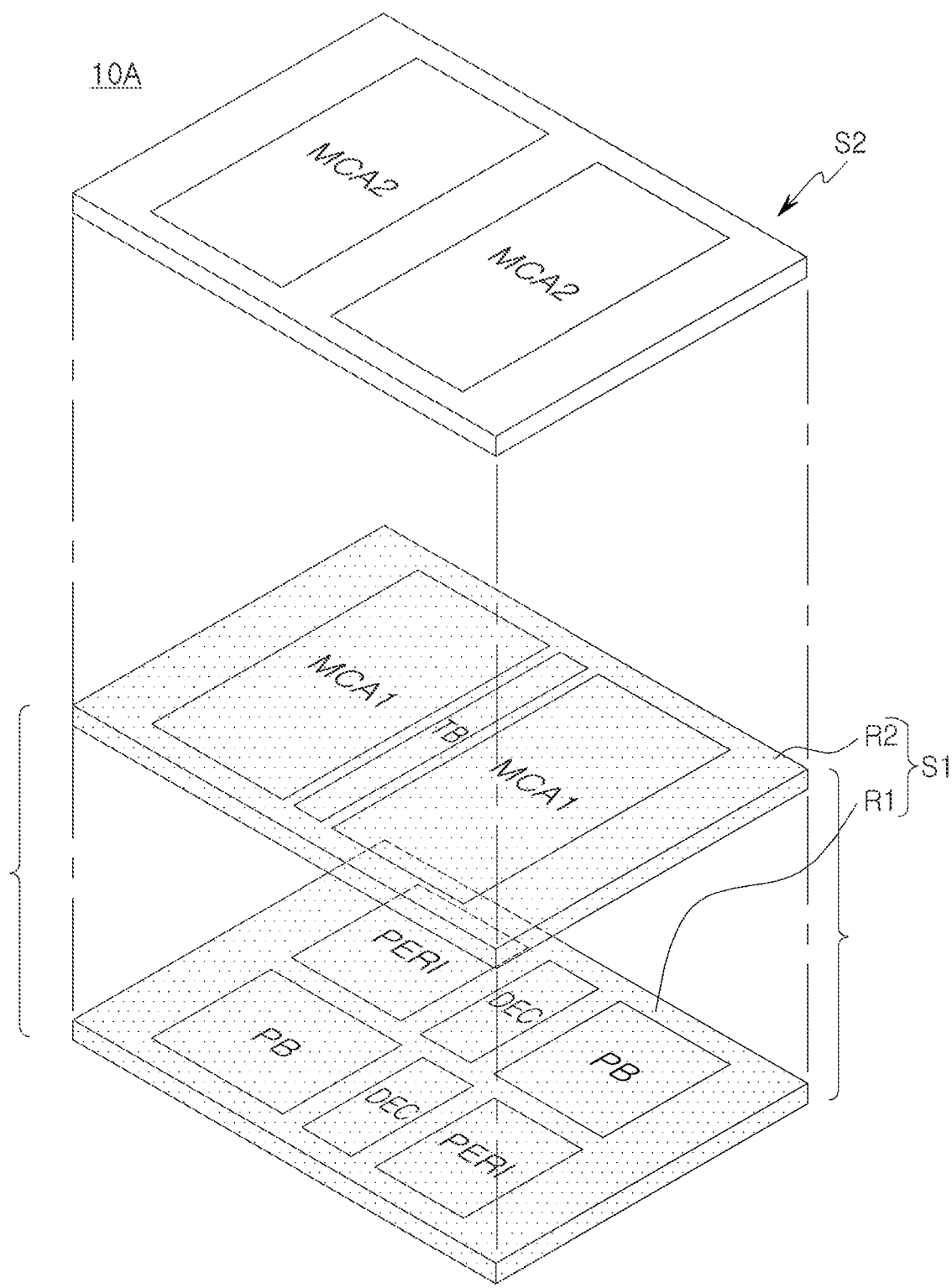
FIGS. 3A and 3B are schematic layout diagrams illustrating an arrangement of a semiconductor device according to example embodiments.
Figure 3B:
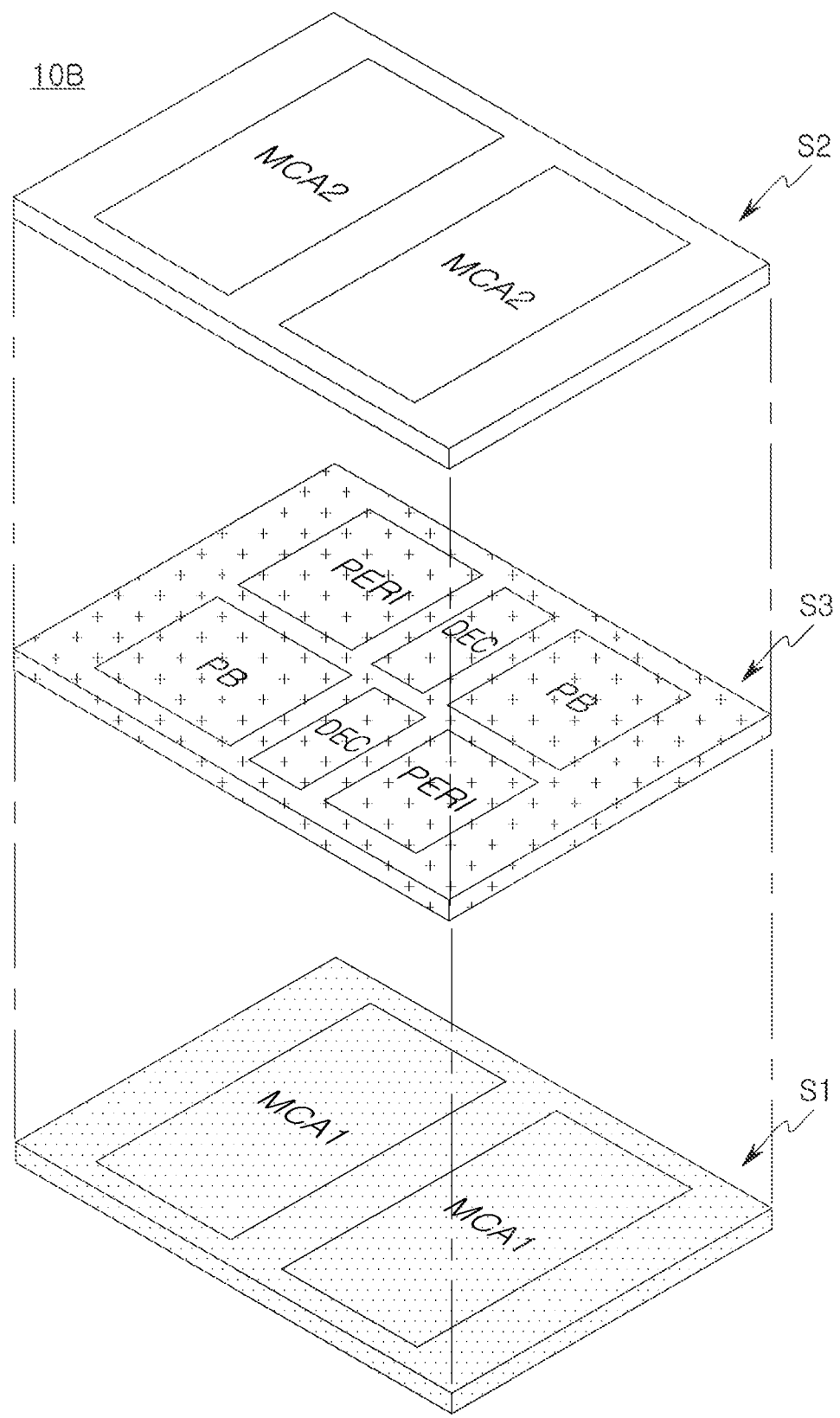

FIGS. 3A and 3B are schematic layout diagrams illustrating an arrangement of a semiconductor device according to example embodiments.

Referring to FIG. 3A, a semiconductor device 10A may include a first substrate structure S1 and a second substrate structure S2, stacked in a vertical direction. The first substrate structure S1 may include a first region R1 and a second region R2, the first region R1 may form the peripheral circuit 30 of FIG. 1, and the second region R2 may form the memory cell array 20. The first region R1 may include a row decoder DEC, a page buffer PB, and other peripheral circuits PERI. The second region R2 may include first memory cell arrays MCA1 and a through wiring region TB. The second substrate structure S2 may form the memory cell array 20, and may include second memory cell arrays MCA2. In some embodiments, the first region R1 is a first vertical region spanning a first vertical height range, and the second region R2 is a second vertical region spanning a second vertical height range. The first region R1 may be referred to as a first level, or bottom level, the second region R2 may be referred to as a second level, or middle level, and the second substrate structure S2 may be described as being at a third level, or top level.

In the first region R1, the row decoder DEC corresponds to the row decoder 32 described above with reference to FIG. 1, and the page buffer PB may correspond to a region corresponding to the page buffer 34. Moreover, other peripheral circuits PERI may be a region including the control logic 36 and the voltage generator 37 of FIG. 1, and may include, for example, a latch circuit, a cache circuit, or a sense amplifier. In addition, other peripheral circuits PERI may include the I/O buffer 35 of FIG. 1, and may include an electrostatic discharge (ESD) element or a data input/output circuit. In example embodiments, the I/O buffer 35 may be disposed to form a separate region around other peripheral circuits PERI.

In the first region R1, at least a portion of various circuit regions DEC, PB, and PERI described above may be disposed in a lower portion of the first memory cell arrays MCA1 of the second region R2. For example, the page buffer PB and other peripheral circuits PERI may be disposed to overlap the first memory cell arrays MCA1 in a lower portion of the first memory cell arrays MCA1. However, in example embodiments, circuits included in the first region R1 and arrangement may be variously changed, so circuits disposed to overlap the first memory cell arrays MCA1 may also be variously changed.

In the second region R2, the first memory cell arrays MCA1 may be spaced apart from each other and disposed in parallel. However, in example embodiments, the number of the first memory cell arrays MCA1 disposed in the first region R2 and arrangement may be variously changed. For example, the first memory cell arrays MCA1 according to the example embodiment may be arranged continuously and repeatedly.

The through wiring regions TB may be a region including a wiring structure passing through the second region R2 and connected to the first region R1. The through wiring regions TB may be disposed on at least one side of the first memory cell arrays MCA1, and may include, for example, a wiring structure such as a contact plug electrically connected to the row decoder DEC of the first region R1, or the like. However, a through wiring structure may be disposed in the first memory cell arrays MCA1. For example, regions including a wiring structure electrically connected to the page buffer PB of the first region R1 may be disposed therein.

In the second substrate structure S2, the second memory cell arrays MCA2 may be spaced apart from each other and disposed in parallel. The second memory cell arrays MCA2 may be disposed in a position corresponding to the first memory cell arrays MCA1 of the first substrate structure S1, but are not limited thereto. In example embodiments, the number of the second memory cell arrays MCA2 disposed in the second substrate structure S2 and arrangement may be variously changed.

Referring to FIG. 3B, a semiconductor device 10B may include a first substrate structure S1, a second substrate structure S2, and a third substrate structure S3, stacked in a vertical direction. The first substrate structure S1 and the second substrate structure S2 may form the memory cell array 20 of FIG. 1. The third substrate structure S3, disposed between the first substrate structure S1 and the second substrate structure S2, may form the peripheral circuit 30 of FIG. 1. The first substrate structure S1 and the second substrate structure S2 may include first memory cell arrays MCA1 and second memory cell arrays MCA2, respectively. The third substrate structure S3 may include a row decoder DEC, a page buffer PB, and other peripheral circuits PERI, and the description of the first region R1 described above with reference to FIG. 3A may be applied in a similar manner.

Figure 4:
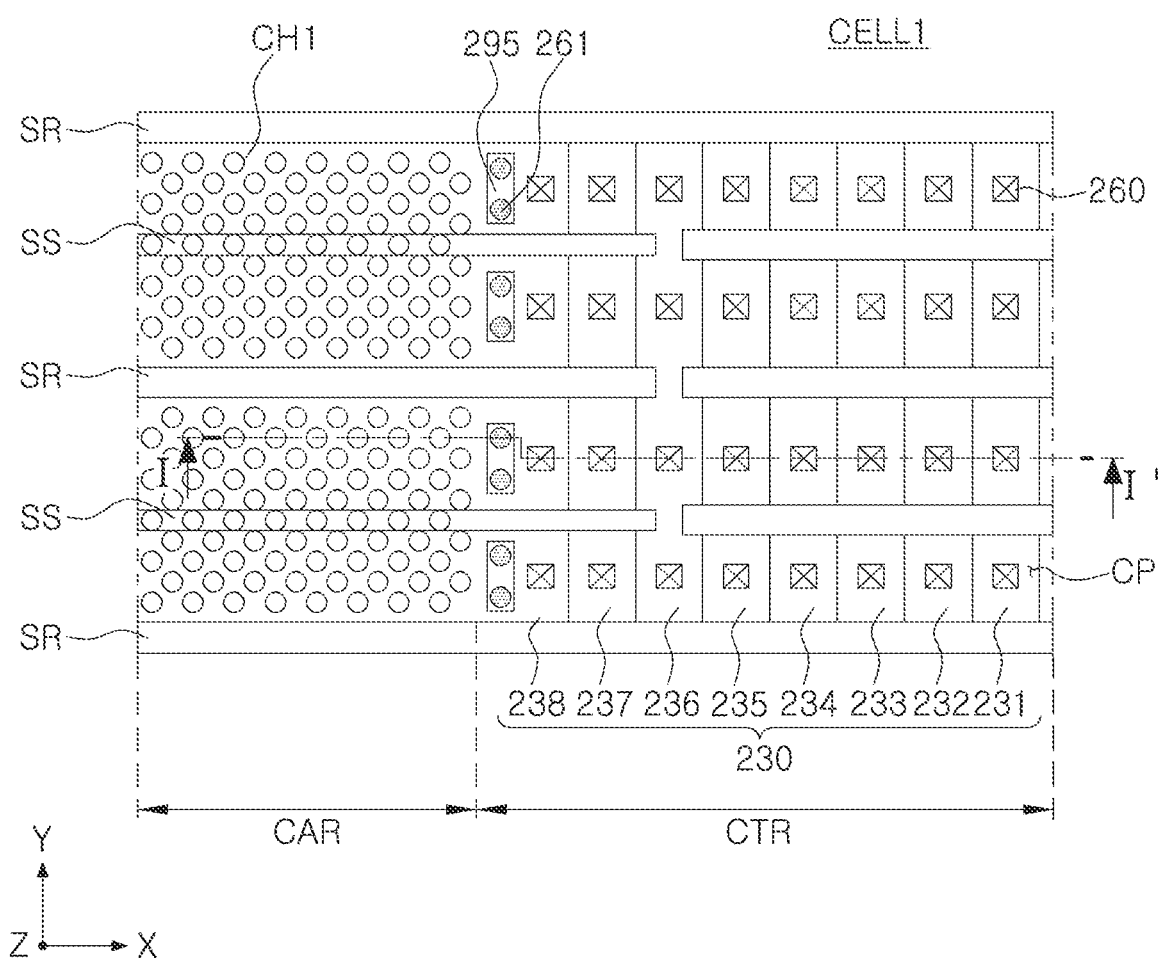
FIG. 4 is a schematic plan view of a semiconductor device according to example embodiments.
Figure 5:
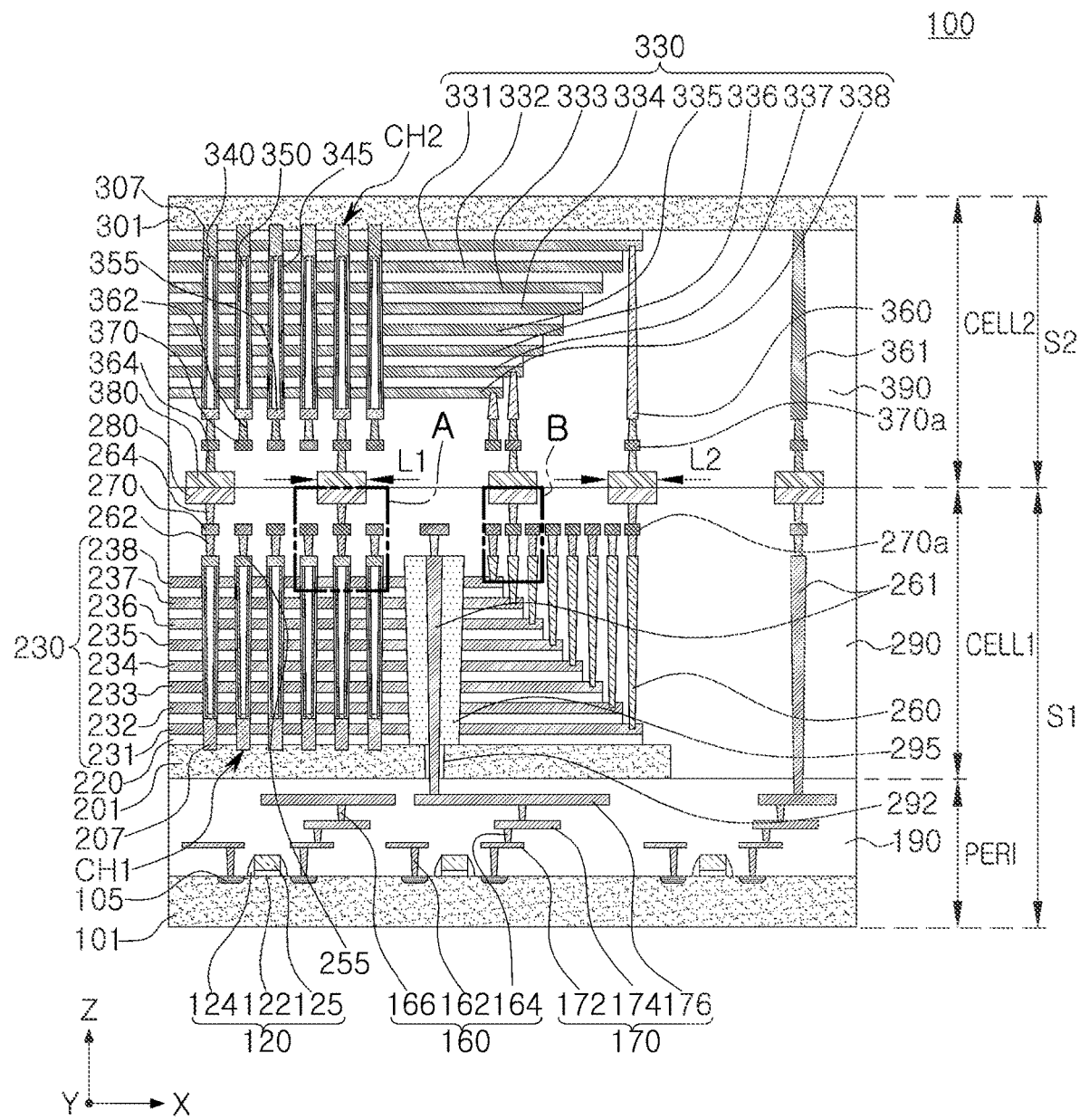
FIG. 5 is a schematic cross-sectional view of a semiconductor device according to example embodiments.

FIG. 4 is a schematic plan view of a semiconductor device according to example embodiments. In FIG. 4, only main components of a first memory cell region CELL1 of the semiconductor device 100 are illustrated. FIG. 5 is a schematic cross-sectional view of a semiconductor device according to example embodiments. FIG. 5 illustrates a cross section cut along line I-I' of FIG. 4, including a cross section of the first memory cell region CELL1.

Referring to FIGS. 4 and 5, the semiconductor device 100 may include a first substrate structure S1 and a second substrate structure S2, vertically stacked. The first substrate structure S1 may include a first memory cell region CELL1 and a peripheral circuit region PERI. The second substrate structure S2 may include a second memory cell region CELL2.

In the first substrate structure S1, the first memory cell region CELL1 may be disposed on an upper end (e.g., top face or top surface) of a peripheral circuit region PERI. In example embodiments, on the other hand, the first memory cell region CELL1 may be disposed on a lower end (e.g., bottom face or bottom surface) of the peripheral circuit region PERI. The peripheral circuit region PERI may include a base substrate 101, circuit elements 120 disposed on the base substrate 101, as well as circuit contact plugs 160 and circuit wiring lines 170.

The base substrate 101 may have the upper surface extending in the X-direction and a Y-direction. The base substrate 101 may have separate element separation layers formed therein such that an active region may be defined. A portion of the active region may have source/drain regions 105 disposed therein and including an impurity. The base substrate 101 may include a semiconductor material, such as a Group IV semiconductor, a Group III-V compound semiconductor, or a Group II-VI compound semiconductor. For example, the base substrate 101 may be provided as a single crystal bulk wafer. The base substrate 101 may be described as a base semiconductor substrate, or more generally as a semiconductor substrate, which may be differentiated from other semiconductor substrates of the semiconductor device by use of ordinal numerical identifiers (e.g., first, second, or third). It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The circuit elements 120 may include, for example, a planar transistor. Each of the circuit elements 120 may include a circuit gate dielectric layer 122, a spacer layer 124, and a circuit gate electrode 125. The source/drain regions 105 may be disposed in the base substrate 101 at both sides of the circuit gate electrode 125.

The peripheral region insulating layer 190 may be disposed on the circuit element 120 on the base substrate 101. The circuit contact plugs 160 may pass through the peripheral region insulating layer 190 to be connected to the source/drain regions 105, and may include first to third circuit contact plugs 162, 164, and 166, sequentially positioned from the base substrate 101. The circuit contact plugs 160 may allow an electrical signal to be applied to the circuit element 120. In a region not illustrated, circuit contact plugs 160 may be connected to the circuit gate electrode 125. The circuit wiring lines 170 may be connected to the circuit contact plugs 160, and may include first to third circuit wiring lines 172, 174, and 176, forming a plurality of layers.

The first memory cell region CELL1, as illustrated in FIG. 4, may include a first substrate 201 having a cell array region CAR, which is a first region, and a cell connection region CTR, which is a second region, first gate electrodes 230 stacked on the first substrate 201, first interlayer insulating layers 220 alternately stacked with the first gate electrodes 230, gate separation regions SR extended while passing through a stacked structure of the first gate electrodes 230, upper separation regions SS passing through a portion of the first gate electrodes 230, first channels CH1 disposed to pass through the first gate electrodes 230, and a first cell region insulating layer 290 covering the first gate electrodes 230. The first memory cell region CELL1 may further include first cell contact plugs 260, first through contact plugs 261, first lower contact plugs 262, first bit lines 270 and 270a, second lower contact plugs 264, and first bonding pads 280, which are wiring structures for applying a signal to the first channels CH1 and the first gate electrodes 230.

The cell array region CAR of the first substrate 201 may be a region in which the first gate electrodes 230 are vertically stacked and first channels CH1 are disposed, and may be a region corresponding to the memory cell array 20 of FIG. 1, while the cell connection region CTR may be a region in which the first gate electrodes 230 extend lengthwise by different lengths, and may correspond to a region for electrically connecting the memory cell array 20 to the peripheral circuit 30 of FIG. 1. An item, layer, or portion of an item or layer described as extending "lengthwise" in a particular direction has a length in the particular direction and a width perpendicular to that direction, where the length is greater than the width. The cell connection region CTR may be disposed in at least one end of the cell array region CAR in at least one direction, for example, an X-direction.

The first substrate 201 may have the upper surface extending in the X-direction and a Y-direction. The first substrate 201 may include a semiconductor material, such as a Group IV semiconductor, a Group III-V compound semiconductor, or a Group II-VI compound semiconductor. For example, the Group IV semiconductor may include silicon, germanium, or silicon-germanium. For example, the first substrate 201 may be provided as a polycrystalline layer or an epitaxial layer. The first substrate 201 may be described as a memory cell region semiconductor substrate, or more generally as a semiconductor substrate, which may be differentiated from other semiconductor substrates of the semiconductor device by use of ordinal numerical identifiers (e.g., first, second, or third).

The first gate electrodes 230 may be stacked and spaced apart from each other in a direction perpendicular to the first substrate 201, thereby forming a stacked structure together with the first interlayer insulating layers 220. The first gate electrodes 230 may include a first lower gate electrode 231, forming a gate of the first ground select transistor GST1 of FIG. 2A, first memory gate electrodes 232 to 236, forming a plurality of first memory cells MC1, and first upper gate electrodes 237 and 238, forming a gate of the first string select transistors SST1_1 and SST1_2. The number of the first memory gate electrodes 232 to 236, forming the first memory cells MC1, may be determined depending on capacity of the semiconductor device 100. According to an example embodiment, the first upper and lower gate electrodes 231, 237, and 238 of the first string select transistors SST1_1 and SST1_2 and the first ground select transistor GST1 may be provided in an amount of one or two or more, and may have the same or different structure from that of the first gate electrodes 230 of the first memory cells MC1. Some first gate electrodes 230, for example, first memory gate electrodes 232 to 236, adjacent to the first upper or lower gate electrode 231, 237, and 238, may be dummy gate electrodes.

The first gate electrodes 230 may be stacked and spaced apart from each other in the cell array region CAR, and may extend lengthwise by different lengths from the cell array region CAR into the cell connection region CTR to form a stepped staircase structure. The first gate electrodes 230 are stepped in the X-direction as illustrated in FIG. 5, and may be disposed to be stepped in the Y-direction. Due to the stepped portion, a first gate electrode 230 in a lower portion is extended longer into the cell connection region CTR (and has a longer overall length in the X-direction) than a first gate electrode 230 in an upper portion, so the first gate electrodes 230 may provide contact regions CP exposed upwardly. The first gate electrodes 230 may be connected to the first cell contact plugs 260 in the contact regions CP, respectively.

As illustrated in FIG. 4, the first gate electrodes 230 may be disposed to be separated from each other in the Y-direction by gate separation regions SR extended in the X-direction. The first gate electrodes 230, between a pair of gate separation regions SR continuously extending in the X-direction among the gate separation regions SR, may form a single memory block, but a range of a memory block is not limited thereto. A portion of the first gate electrodes 230, for example, first memory gate electrodes 232 to 236 may form a single layer in a single memory block.

The first interlayer insulating layers 220 may be disposed between the first gate electrodes 230. The first interlayer insulating layers 220 may also be disposed to be spaced apart from each other in a direction perpendicular to the upper surface of the first substrate 201 and to extend lengthwise in the X-direction, in a manner similar to the first gate electrodes 230. The first interlayer insulating layers 220 may contain an insulating material, such as silicon oxide or silicon nitride.

The gate separation regions SR may be disposed to pass through the first gate electrodes 230 in the cell array region CAR and the cell connection region CTR and to extend in the X-direction. The gate separation regions SR may be arranged parallel to each other. In the gate separation regions SR, a continuously extended pattern and an intermittently extended pattern may be alternately disposed in the Y-direction. However, the arrangement order, the number, and the like, of the gate separation regions SR, are not limited to those illustrated in FIG. 4. The gate separation regions SR may pass through the entirety of the first gate electrodes 230, stacked on the first substrate 201, and may be connected to the first substrate 201. The first common source line CSL1, described with reference to FIGS. 2A and 2B, may be disposed in the gate separation regions SR, and the dummy common source line may be disposed in at least a portion of the gate separation regions SR. However, the first common source line CSL1 may be disposed in the first substrate 201 or below the first substrate 201, according to example embodiments.

Upper separation regions SS may extend in the X-direction between the gate separation regions SR. The upper separation regions SS may be disposed in a portion of the cell connection region CTR and the cell array region CAR, to pass through a portion of first gate electrodes 230, including the first upper gate electrodes 237 and 238, among the first gate electrodes 230. The first upper gate electrodes 237 and 238, separated by the upper separation regions SS, may form different first string select lines SSL1_1 and SSL1_2 (See FIGS. 2A and 2B). The upper separation regions SS may include an insulating layer. The upper separation regions SS may separate, for example, a total of three first gate electrodes 230, including the first upper gate electrodes 237 and 238, from each other in the Y-direction. However, the number of the first gate electrodes 230, separated by the upper separation regions SS, may be variously changed in example embodiments. In example embodiments, the first substrate structure S1 may further include insulating layers separating first lower gate electrodes 231 among the first gate electrodes 230. For example, the insulating layer may be disposed to separate first lower gate electrodes 231 in a region between the gate separation regions SR, spaced apart from each other on a straight line and arranged intermittently.

The through wiring insulating layer 295 may be disposed to pass through the first gate electrodes 230 and the first interlayer insulating layers 220 from an upper portion of the first gate electrodes 230. The through wiring insulating layer 295 may be a region in which a wiring structure for connection of the first memory cell region CELL1 and the peripheral circuit region PERI is disposed. The through wiring insulating layer 295 may include an insulating material such as a silicon oxide or a silicon nitride.

The first channels CH1 may be spaced apart from each other in rows and columns on the cell array region CAR. The first channels CH1 may be disposed to form a grid pattern or disposed in a zigzag form in a direction. The first channel CH1 may have a columnar shape, and may have an inclined side surface narrowing towards the first substrate 201 according to aspect ratios. In example embodiments, dummy channels may be further disposed in an end portion of the cell array region CAR, adjacent to the cell connection region CTR, and the cell connection region CTR. As for a specific structure of the first channels CH1, a description of the second channels CH2 described below may be applied in a similar manner.

The first memory cell region CELL1 may further include first cell contact plugs 260, first through contact plugs 261, first lower contact plugs 262, first bit lines 270 and 270a, second lower contact plugs 264, and first bonding pads 280, which are wiring structures for electrical connection with the peripheral circuit region PERI and the second substrate structure S2. The wiring structures described above may include a conductive material. The wiring structures may include, for example, tungsten (W), aluminum (Al), copper (Cu), a tungsten nitride (WN), a tantalum nitride (TaN), a titanium nitride (TiN), or combinations thereof.

The first cell contact plugs 260 may pass through the first cell region insulating layer 290 to be connected to the first gate electrodes 230 in the contact regions CP. The first cell contact plugs 260 may have a cylindrical shape. In example embodiments, the first cell contact plugs 260 may have an inclined side surface narrowing towards the first substrate 201 according to aspect ratios. Thus, the first cell contact plugs 260 may have a tapered shape that tapers toward the first substrate 201. According to example embodiments, some of the first cell contact plugs 260, connected to certain first gate electrodes 230, may be dummy contact plugs.

The first through contact plugs 261 may be extend vertically and may be connected to circuit wiring lines 170 of the peripheral circuit region PERI in a lower portion. The first through contact plugs 261 may pass through the through wiring insulating layer 295 and the first substrate 201 in a stacked structure of the first gate electrodes 230, and may pass through the first cell region insulating layer 290 outside of the stacked structure of the first gate electrodes 230. The first through contact plugs 261 may be insulated by the first substrate 201 and the side insulating layer 292.

The first lower contact plugs 262 may be disposed on the first channels CH1, the first cell contact plugs 260, and the first through contact plugs 261.

The first bit lines 270 and 270a may be disposed between the first lower contact plugs 262 and the second lower contact plugs 264 at an upper end of the first lower contact plugs 262. The first bit lines 270 and 270a may include first bit lines 270 connected to the first channels CH1, and first bit lines 270a connected to the first cell contact plugs 260 and the first through contact plugs 261. The first bit lines 270, connected to the first channels CH1, may correspond to the first bit lines BL1_0 to BL1_2 of FIG. 2A (noting that FIG. 2A is just a representative portion of the overall semiconductor device 100, and does not show the same number of first bit lines as FIGS. 4 and 5. The first bit lines 270a, connected to the first cell contact plugs 260 and the first through contact plugs 261, do not correspond to the first bit lines BL1_0 to BL1_2 of FIG. 2A, and may be wiring lines formed at the same level, in the same process as that of the first bit lines 270 connected to the first channels CH1. The first bit lines 270a, connected to the first cell contact plugs 260, are illustrated as being disposed on all first gate electrodes 230, but are not limited thereto.

The second lower contact plugs 264 are disposed on the first bit lines 270 and 270a, and may be connected to the first bonding pads 280 in an upper portion.

The first bonding pads 280 are disposed on the second lower contact plugs 264, and an upper surface of the first bonding pads 280 may be exposed with respect to an upper surface of the first substrate structure S1 through the first cell region insulating layer 290. The first bonding pads 280 may serve as a bonding layer for bonding the first substrate structure S1 and the second substrate structure S2. Bonding pads, or other pads, as described herein, are formed of conductive material and have a substantially flat, or planar, outer surface. The first bonding pads 280 may have a large planar area as compared to other wiring structures, in order to be bonded with the second substrate structure S2 and to provide an electrical connection path thereby.

The first bonding pads 280 may be arranged in a constant pattern in each of the cell array region CAR and the cell connection region CTR. The first bonding pads 280 may be disposed at the same level in the cell array region CAR and the cell connection region CTR, and may have the same or different sizes. The first bonding pads 280 may have, for example, a circular or elliptical shape, on a plane, but are not limited thereto. The first bonding pads 280 may have a first maximum length L1 in the cell array region CAR and may have a second maximum length L2 in the cell connection region CTR, and the first maximum length L1 and the second maximum length L2 may be equal or different. Here, a 'maximum length' indicates a length corresponding to a diameter when having a circular shape on a plane, and indicates a length of the longest diagonal line when having a polygonal shape on a plane. The first maximum length L1 may be greater than a maximum width of the first channels CH1. For example, the first maximum length L1 and the second maximum length L2 may range from several hundred nanometers to several micrometers. The first bonding pads 280 may include a conductive material, for example, copper (Cu).

In a manner similar to the first memory cell region CELL1, the second memory cell region CELL2 of the second substrate structure S2 may include a second substrate 301 having a cell array region CAR and a cell connection region CTR, second gate electrodes 330 stacked on the second substrate 301, gate separation regions SR extending while passing through a stacked structure of the second gate electrodes 330, upper separation regions SS passing through a portion of the second gate electrodes 330, and second channels CH2 disposed to pass through the second gate electrodes 330. The second memory cell region CELL2 may further include second interlayer insulating layers 320 alternately stacked with the second gate electrodes 330 on the second substrate 301, a second channel region 340 in the second channels CH2, a second gate dielectric layer 345, a second channel insulating layer 350, a second channel pad 355, and a second cell region insulating layer 390. The second memory cell region CELL2 may further include second cell contact plugs 360, a second through contact plug 361, first upper contact plugs 362, second bit lines 370 and 370a, second upper contact plugs 364, and second bonding pads 380, which are wiring structures for applying a signal to the second channels CH2 and the second gate electrodes 330.

In the second substrate structure S2, at least gate electrodes and channels may have a symmetrical structure with those of the first substrate structure S1, based on an interface of the first substrate structure S1. With respect to each component forming the second substrate structure S2, the description of each component in the first memory cell region CELL1 of the first substrate structure S1 may be applied thereto in a similar manner, unless otherwise described. In the following discussion of the second substrate structure S2 as a singular structure, the second substrate 301 is described as the bottom of the second substrate structure S2, and orientations of other components of the second substrate structure S2 are described with that context in mind. The second substrate 301 may be described later in connection with the entire semiconductor device 100 as a top of the semiconductor device 100 or as being above certain other components.

The second substrate 301 may include a semiconductor material, such as a Group IV semiconductor, a Group III-V compound semiconductor, or a Group II-VI compound semiconductor. For example, the second substrate 301 may be provided as a single crystal bulk wafer, may be formed of a substrate the same as the base substrate 101, and may be formed of a material having crystallinity different from that of the first substrate 201. The second substrate 301 may be described as a memory cell region semiconductor substrate, or more generally as a semiconductor substrate, which may be differentiated from other semiconductor substrates of the semiconductor device by use of ordinal numerical identifiers (e.g., first, second, or third). The base substrate 101, first substrate 201, and second substrate 301 may be described as different-level substrates, such as first-level substrate, second-level substrate, and third-level substrate, where the levels refer to different vertical levels within the semiconductor device 100.

The second gate electrodes 330, in an amount the same as that of the first gate electrodes 230, may be stacked on the third substrate 301. However, the number of the second gate electrodes 330 may be variously changed in example embodiments, and the second gate electrodes 230 may be provided in an amount different from that of the first gate electrodes 230.

The second channel region 340 may be disposed in the second channels CH2. In the second channel CH2, the second channel region 340 may have an annular form surrounding the second channel insulating layer 350, formed therein. However, the second channel region may have a columnar shape without the second channel insulating layer 350, such as a cylinder or a prism, according to an example embodiment. The second channel region 340 may be connected to a second epitaxial layer 307 in a lower portion of the second channel region. The second channel region 340 may contain a semiconductor material such as polycrystalline silicon or single crystalline silicon, and the semiconductor material may be a material undoped with an impurity, or a material containing p-type or n-type impurities. The second channels CH2, disposed on a straight line in the Y-direction between the gate separation regions SR and the upper separation region SS, may be connected to different second bit lines 370, according to arrangement of an upper wiring structure connected to the second channel pad 355.

The second channel pads 355 may be disposed in an upper portion of the second channel region 340 in the second channels CH2. The second channel pads 355 may be disposed to cover an upper surface of the second channel insulating layer 350 and to be electrically connected to the second channel region 340. The second channel pads 355 may include, for example, doped polycrystalline silicon.

The second gate dielectric layer 345 may be disposed between the second gate electrodes 330 and the second channel region 340. Although not specifically illustrated, the second gate dielectric layer 345 may include a tunneling layer, a charge storage layer, and a blocking layer sequentially stacked from the second channel region 340. The tunneling layer may allow a charge to tunnel to the charge storage layer, and may include, for example, silicon oxide (SiO$_2$), silicon nitride (Si$_3$N$_4$), silicon oxynitride (SiON), or combinations thereof. The charge storage layer may be a charge trap layer or a floating gate conductive layer. The blocking layer may include silicon oxide (SiO$_2$), silicon nitride (Si$_3$N$_4$), silicon oxynitride (SiON), a high-k dielectric material or combinations thereof. In example embodiments, at least a portion of the second gate dielectric layer 345 may be extended in a horizontal direction along the second gate electrodes 330.

The second epitaxial layer 307 may be disposed on the second substrate 301 in a lower end of the second channels CH2, and may be disposed in a side surface of at least one second gate electrode 330. The second epitaxial layer 307 may be disposed in a recessed region of the second substrate 301. A level of an upper surface of the second epitaxial layer 307 may be higher than a level of an upper surface of a lowermost second gate electrode 331 and may be lower than a level of a lower surface of a second gate electrode 332 located thereabove, but it is not limited to that illustrated in the drawings. In example embodiments, the second epitaxial layer 307 may be omitted. In this case, the second channel region 340 may be directly connected to the second substrate 301 or may be connected to another conductive layer on the second substrate 301.

The second cell contact plugs 360 may only be disposed on the second gate electrodes 330 connected to the first cell contact plugs 260 of the first substrate structure S1 at one end (e.g., in the X-direction) of the second gate electrodes 330 illustrated in the drawings. Thus, the second cell contact plugs 360, connected to the second memory gate electrodes 332 to 336, may be connected to the second cell contact plugs 360 at the other end of the second gate electrodes 330 in the X-direction of a stacked structure of the second gate electrodes 330. The other end of the second gate electrodes 330 in the X-direction may also have a stepped staircase structure. In this case, the second cell contact plugs 360, connected to the second memory gate electrodes 332 to 336, may be connected to the peripheral circuit region PERI of the first substrate structure S1 through first through contact plugs 261. However, example embodiments are not limited thereto, and the second cell contact plugs 360 may be disposed on the second memory gate electrodes 332 to 336 according to example embodiments. However, in this case, the second cell contact plugs 360, disposed on the second memory gate electrodes 332 to 336, are not connected to the first cell contact plugs 260, and may be connected to the peripheral circuit region PERI of the first substrate structure S1 in a region not illustrated in the drawings.

The second through contact plugs 361 may pass through the second cell region insulating layer 390 to be connected to the second substrate 301, and may be connected to the first through contact plugs 261 of the first memory cell region CELL1 through the second bonding pads 380 at a lower end.

The first substrate structure S1 and the second substrate structure S2 may be bonded by bonding of the first bonding pads 280 and the second bonding pads 380, for example, copper (Cu)-to-copper (Cu) bonding. The first bonding pads 280 and the second bonding pads 380 may have an area relatively larger than that of other configurations of the wiring structure, such as the first bit lines 270 and the second bit lines 370, so reliability of the electrical connection between the first substrate structure S1 and the second substrate structure S2 may be improved. In example embodiments, the first substrate structure S1 and the second substrate structure S2, may be bonded by hybrid bonding due to bonding of the first bonding pads 280 and the second bonding pads 380, and dielectric-to-dielectric bonding of the first cell region insulating layer 290 and the second cell region insulating layer 390, disposed around the first bonding pads 280 and the second bonding pads 380.

In detail, in the semiconductor device 100, the first bit lines 270 and the second bit lines 370, disposed adjacent to a bonding interface of the first substrate structure S1 and the second substrate structure S2, may be electrically connected to each other by a wiring structure including the first bonding pads 280 and the second bonding pads 380. The first bit lines 270 and the second bit lines 370 may be physically and electrically connected through the second lower contact plug 264, the first bonding pads 280 and the second bonding pads 380, as well as the second upper contact plug 364. In detail, the first bit line 270 and the second bit line 370, vertically disposed in the Z-direction in parallel, may be electrically connected to each other. Moreover, for example, the first channels CH1 and the second channels CH2, vertically disposed opposite each other in the Z-direction, may be electrically connected to each other, but the embodiments are not limited thereto. Thus, the first channels CH1 and the second channels CH2, vertically disposed directly opposite each other, may have a structure sharing the first bit lines 270 and the second bit lines 370. However, according to example embodiments, the first channels CH1 may share the first bit lines 270 and the second bit lines 370 with second channels CH2 spaced apart from each other in a horizontal direction, rather than second channels CH2 disposed in the Z-direction directly opposite the first channels CH1. As described above the semiconductor device 100 may have a bit line sharing structure, and a degree of integration may be improved due to the structure described above. Though not shown in FIG. 5, in some embodiments, each first bit line 270 in the cell array region CAR of the first substrate structure S1 is connected to a respective second lower contact plug 264 and to a first bonding pad 280, and each second bit line 370 in the cell array region CAR of the second substrate structure S2 is connected to a respective second upper contact plug 364 and to a second bonding pad 380.

In the semiconductor device 100, at least some of the first gate electrodes 230 and the second gate electrodes 330 may be electrically connected to each other. In an example embodiment, as illustrated in a circuit diagram of FIG. 2A, and FIG. 5, first upper gate electrodes 237 and 238 forming a gate of the first string select transistors SST1_1 and SST1_2 as well as first lower gate electrodes 231 forming a gate of the first ground select transistor GST1, among the first gate electrodes 230, may be electrically connected to second upper gate electrodes 337 and 338 forming a gate of the second string select transistors SST2_1 and SST2_2 as well as second lower gate electrodes 331 forming a gate of the second ground select transistor GST2, among the second gate electrodes 330, respectively. However, according to example embodiments, only one of the string select transistors SST1_1, SST1_2, SST2_1, and SST2_2 and the ground select transistors GST1 and GST2 may be electrically connected to each other. Alternatively, all of the first gate electrodes 230 and the second gate electrodes 330 may be individually controlled. The first gate electrodes 230 and the second gate electrodes 330, electrically connected to each other, may be directly electrically connected at an interface through a wiring structure including the first bonding pads 280 and the second bonding pads 380. A direct electrical connection described herein refers to a connection between two components via a continuous electrically conductive path formed therebetween. In detail, the first gate electrodes 230 and the second gate electrodes 330 may be physically and electrically connected to each other, through a first cell contact plug 260, a first lower contact plug 262, a first bit line 270a, a second lower contact plug 264, first bonding pads 280 and second bonding pads 380, a second upper contact plug 364, a second bit line 370a, a first upper contact plug 362, and a second cell contact plug 360. A first gate electrode 238 and a second gate electrode 338, in an uppermost portion, are also connected to each other through first bonding pads 280 and second bonding pads 380, in a manner similar to the first gate electrode 237 and the second gate electrode 337 in a lower portion, in a region not illustrated.

As can be seen in FIG. 5, in the semiconductor device 100, a cell array region CAR of a second memory cell region CELL2 of a second substrate structure S2 is formed on a cell array region CAR of a first memory cell region CELL1 of a first substrate structure S1 in a symmetrical manner. Accordingly, in relation to the overall semiconductor device 100 having a base substrate 101 at the bottom, various plugs in a bottom substrate structure (e.g., first cell contact plugs 260 and first through contact plugs 261 of the first substrate structure S1) are tapered in a first direction such as downward, such that their width gets smaller in a downward direction, and various plugs in a top substrate structure (e.g., second cell contact plugs 360 and second through contact plugs 361 of the second substrate structure S2) are tapered in a second direction such as upward, such that their width gets larger in a downward direction. Thus, the tapering direction of certain plugs in a first (e.g., upper) substrate structure (e.g., second substrate structure S2) may be opposite the tapering direction of certain plugs in a second (e.g., lower) substrate structure (e.g., first substrate structure S1).

Figure 6:
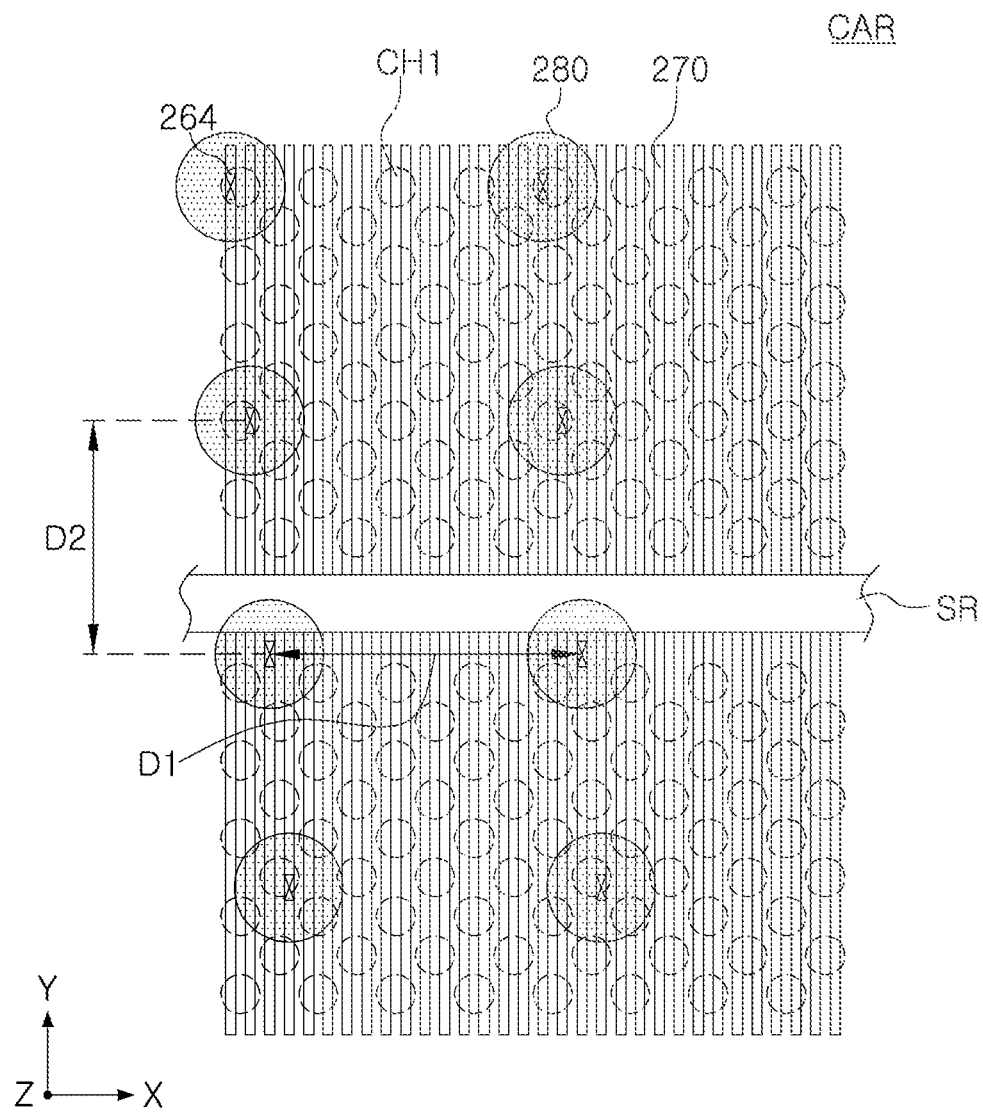
FIG. 6 is a layout diagram illustrating a portion of a semiconductor device according to example embodiments.

FIG. 6 is a layout diagram illustrating a portion of a semiconductor device according to example embodiments.

Referring to FIG. 6, a portion of the cell array region CAR of FIG. 4 is illustrated, and arrangement on a plane, of the first channels CH1, the first bit lines 270, the second lower contact plugs 264, and the first bonding pads 280 is illustrated.

The first bit lines 270 are extended in one direction, and two first bit lines 270 may be placed over an upper portion of a single first channel CH1. The first bonding pads 280 may be disposed over an upper portion of the first bit lines 270, and at least one first bonding pad 280 may be connected for each first bit line 270. Each first bonding pad 280, connected to a first bit line 270, may be disposed over an upper portion of the first bit line 270 at a connection point, and may be connected to the first bit line 270 through a second lower contact plug 264. The second lower contact plug 264 is illustrated as a quadrangle, but is not limited thereto, and may have various shapes such as an elongated, elliptical, or circular shape. Moreover, in example embodiments, the second lower contact plug 264 is extended in the Y-direction along the first bit line 270, and may be disposed to be longer than the first bonding pad 280.

The first bonding pads 280 may be arranged to form a diagonal pattern. The first bonding pads 280 may be disposed in parallel rows for four first channels CH1 in the X-direction, where the parallel rows are diagonal with respect to the extension direction of the first bit lines 270, by way of example. In the Y-direction, the first bonding pads 280 may be disposed on the adjacent first bit line 270, shifted in the X-direction. The first bonding pads 280 have a first pitch D1 in the X-direction, and have a second pitch D2 in the Y-direction, a direction to which the first bit lines 270 are extended. Here, a "pitch" indicates a length between the centers of components adjacent to each other on a plane. When the components are spaced apart from each other, a "pitch" indicates a length, the sum of a maximum length of a component and a minimum distance between components. The second pitch D2 may be greater than the first pitch D1, but is not limited thereto. In example embodiments, the first pitch D1 and the second pitch D2 may be determined in consideration of a size of the cell array region CAR, the number and a size of the first bit lines 270, a size of the first bonding pads 280, and the like.

Figure 7A:
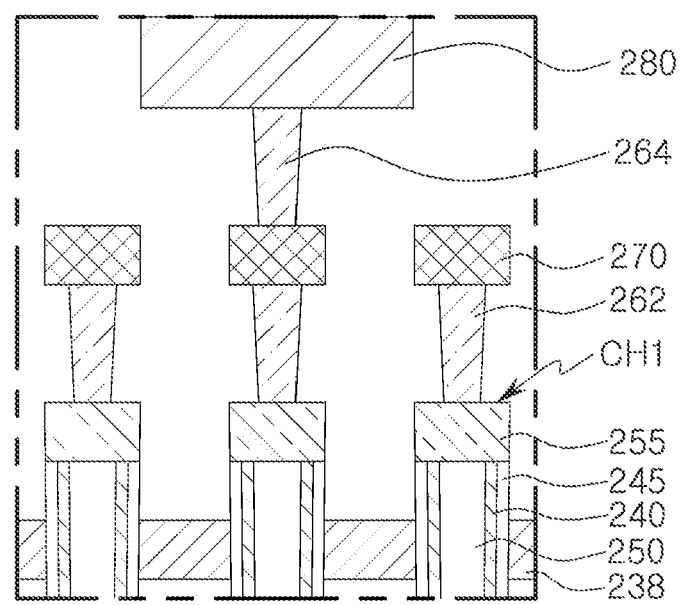
FIGS. 7A and 7B are partially enlarged views of a semiconductor device according to example embodiments.
Figure 7B:
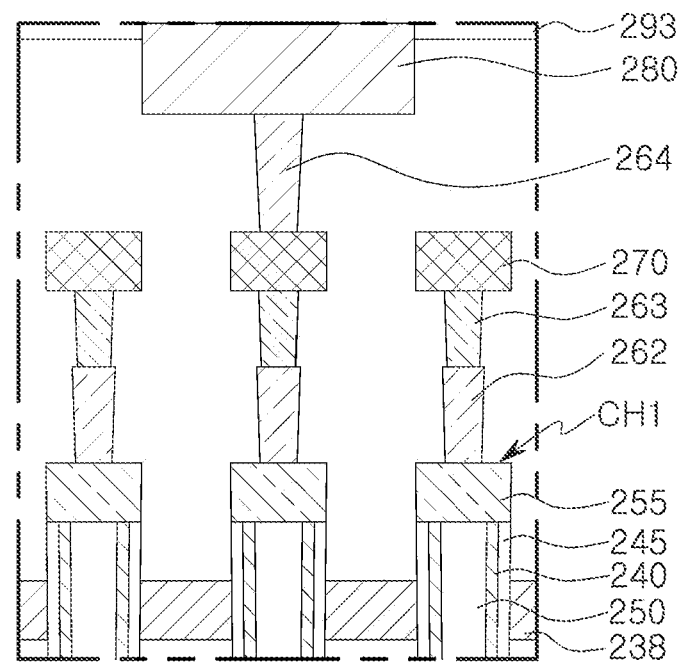

FIGS. 7A and 7B are partially enlarged views of a semiconductor device according to example embodiments. FIGS. 7A and 7B illustrate an enlarged region A of FIG. 5 and an enlarged region corresponding to region A, respectively.

Referring to FIG. 7A, arrangement of wiring structures in an upper portion of the first channel CH1 is enlarged and illustrated. Moreover, the first channel region 240, the first gate dielectric layer 245, the first channel insulating layer 250, and the first channel pad 255 of the first channel CH1 are illustrated together. As described above with reference to FIG. 5, the first lower contact plug 262, the first bit line 270, the second lower contact plug 264, and the first bonding pad 280 are sequentially disposed on an upper portion of the first channel CH1.

Referring to FIG. 7B, a structure of wiring structures according to another example embodiment is illustrated. The wiring structure may include a first lower contact plug 262, an additional contact plug 263, a first bit line 270, a second lower contact plug 264, and a first bonding pad 280, sequentially stacked on an upper portion of the first channel CH1. In this example embodiment, the additional contact plug 263 may be further disposed between the first lower contact plug 262 and the first bit line 270. Moreover, the semiconductor device according to an example embodiment may further include a bonding dielectric layer 293 surrounding the first bonding pad 280. The bonding dielectric layer 293 may have a top surface that is coplanar with a top surface of the bonding pad 280. The bonding dielectric layer 293 is also disposed on a lower surface of the second substrate structure S2, so dielectric-to-dielectric bonding may be performed thereon. The bonding dielectric layer 293 may serve as a diffusion prevention layer of the first bonding pad 280. The bonding dielectric layer 293 may include at least one of, for example, SiO, SiN, SiCN, SiOC, SiON, and SiOCN.

Figure 8A:
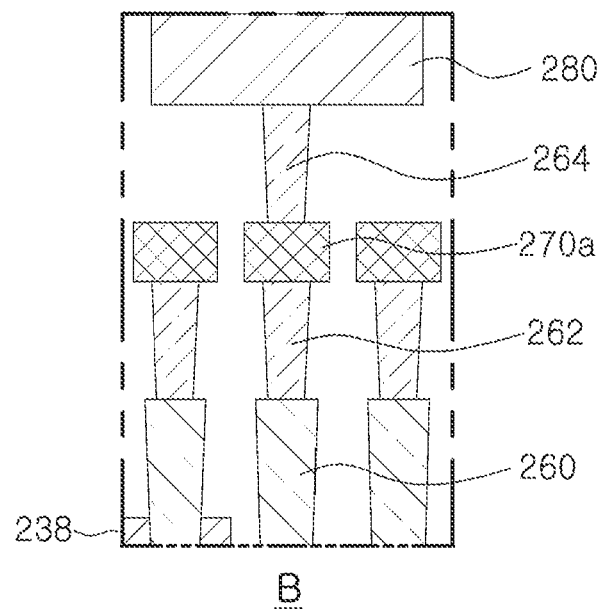
FIGS. 8A and 8B are partially enlarged views of a semiconductor device according to example embodiments.
Figure 8B:
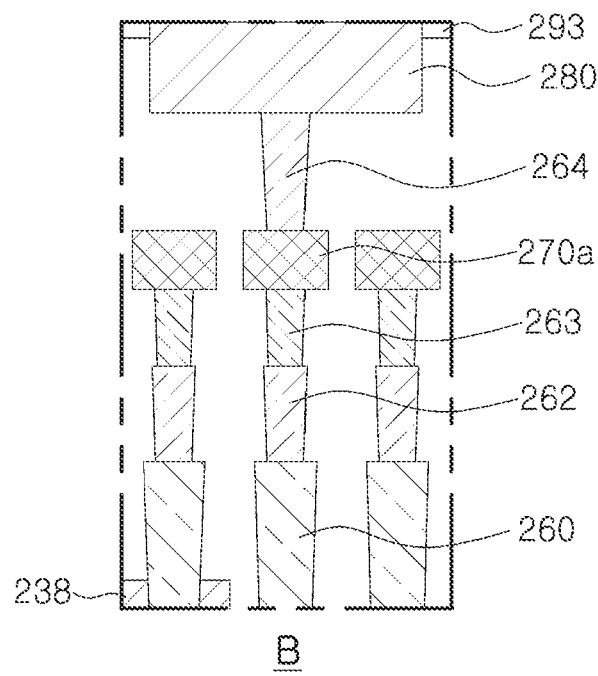

FIGS. 8A and 8B are partially enlarged views of a semiconductor device according to example embodiments. FIGS. 8A and 8B illustrate an enlarged region B of FIG. 5 and an enlarged region corresponding to the region B, respectively.

Referring to FIG. 8A, arrangement of wiring structures in an upper portion of the first cell contact plug 260 is enlarged and illustrated. As described above with reference to FIG. 5, the first lower contact plug 262, the first bit line 270a, the second lower contact plug 264, and the first bonding pad 280 are sequentially disposed on an upper portion of the first cell contact plug 260. The first bit line 270a, disposed in an upper portion of the first cell contact plug 260, is not a layer serving as first bit lines BL1_0 to BL1_2 as illustrated in FIG. 2A in a semiconductor device, but may be a layer serving as a wiring line for vertical connection.

Referring to FIG. 8B, a structure of wiring structures according to another example embodiments is illustrated. The wiring structure may include a first lower contact plug 262, an additional contact plug 263, a first bit line 270a, a second lower contact plug 264, and a first bonding pad 280, sequentially stacked on an upper portion of the first cell contact plug 260. In other words, in an example embodiment, the additional contact plug 263 may be further disposed between the first lower contact plug 262 and the first bit line 270a. Moreover, the semiconductor device according to an example embodiment may further include a bonding dielectric layer 293 surrounding the first bonding pad 280.

As illustrated in FIGS. 7A to 8D, a structure and form of the wiring structure, disposed on an upper portion of the first channel CH1 and the first cell contact plug 260, may be variously changed in example embodiments. Moreover, in a single semiconductor device, structures of wiring structures disposed in an upper portion of the first channel CH1 and an upper portion of the first cell contact plug 260 are not necessarily the same, and different wiring structures may be provided thereon.

FIGS. 9 to 12 are schematic cross-sectional views of a semiconductor device according to example embodiments.

Figure 9:
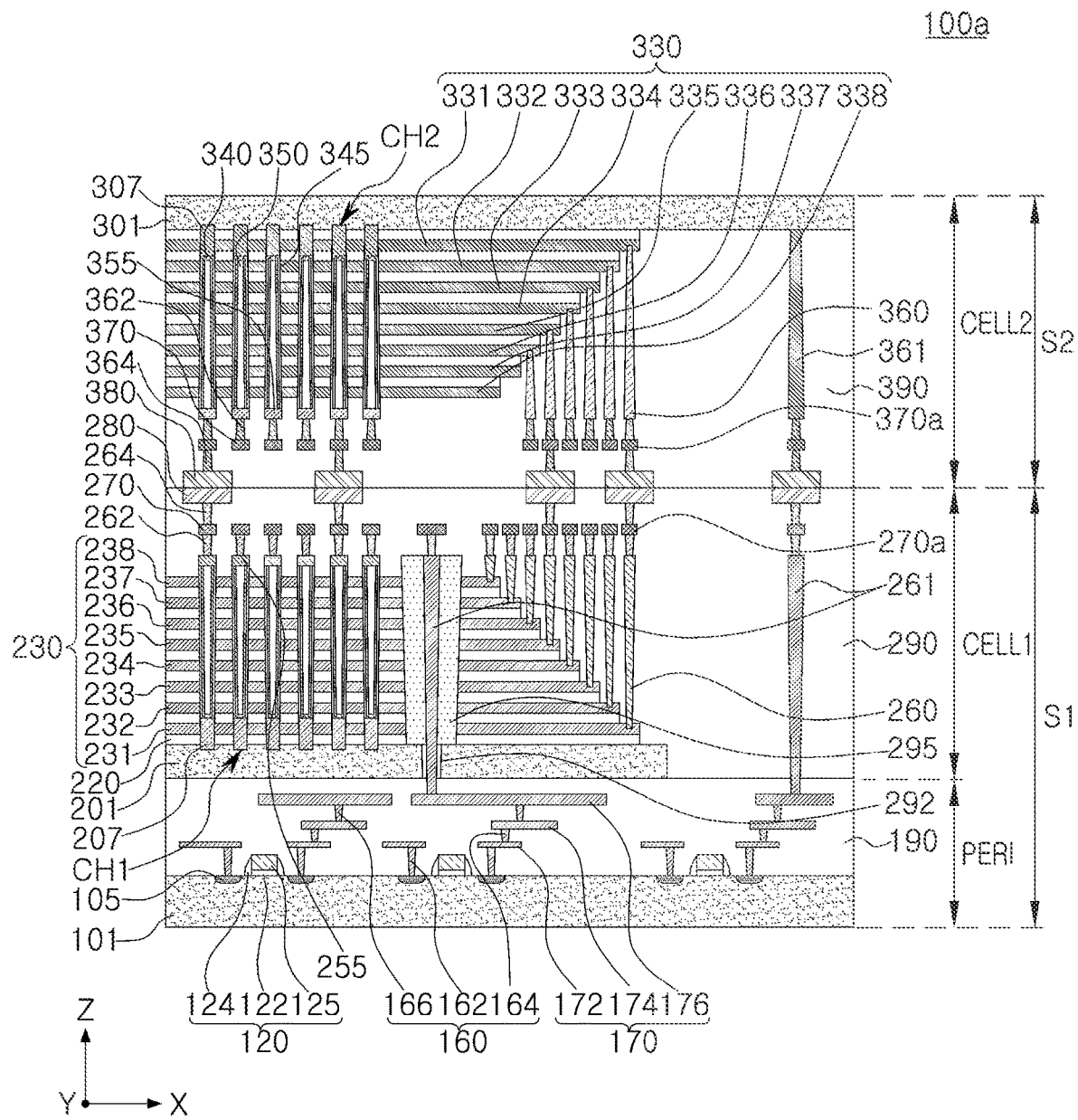
FIGS. 9 to 12 are schematic cross-sectional views of a semiconductor device according to example embodiments.

Referring to FIG. 9, in the semiconductor device 100a, as illustrated in a circuit diagram of FIG. 2B, first memory gate electrodes 232 to 236 forming a gate of the first memory cells MC1 as well as first lower gate electrodes 231 forming a gate of the first ground select transistor GST1, among the first gate electrodes 230, may be electrically connected to second memory gate electrodes 332 to 336 forming a gate of the second memory cells MC2 as well as second lower gate electrodes 331 forming a gate of the second ground select transistor GST2, among the second gate electrodes 330, respectively. In an example embodiment, the string select transistors SST1_1, SST1_2, SST2_1, and SST2_2 are separately controlled, so the first memory cells MC1 and the second memory cells MC2, disposed along the first channel CH1 and the second channel CH2, may be separately operated.

However, according to example embodiments, the first upper gate electrodes 237 and 238 forming a gate of the first string select transistors SST1_1 and SST1_2, and the second upper gate electrodes 337 and 338 forming a gate of the second string select transistors SST2_1 and SST2_2 may be electrically connected to each other. In this case, the first memory cells MC1 and the second memory cells MC2, disposed along the first channel CH1 and the second channel CH2, may be operated in the same manner.

The first gate electrodes 230 and the second gate electrodes 330, electrically connected to each other, may be directly connected at an interface through a wiring structure including the first bonding pads 280 and the second bonding pads 380. Thus, all of the first and second memory gate electrodes 232 to 236 may be connected to each other through the first bonding pads 280 and the second bonding pads 380, in regions not illustrated in the drawings.

The second cell contact plugs 360 may only be disposed on the second gate electrodes 330 connected to the first cell contact plugs 260 of the first substrate structure S1. Thus, the second cell contact plugs 360, connected to the second upper gate electrodes 337 to 338, may be connected to the second cell contact plugs 360 at the other end in the X-direction of a stacked structure of the second gate electrodes 330, but are not limited thereto.

Figure 10:
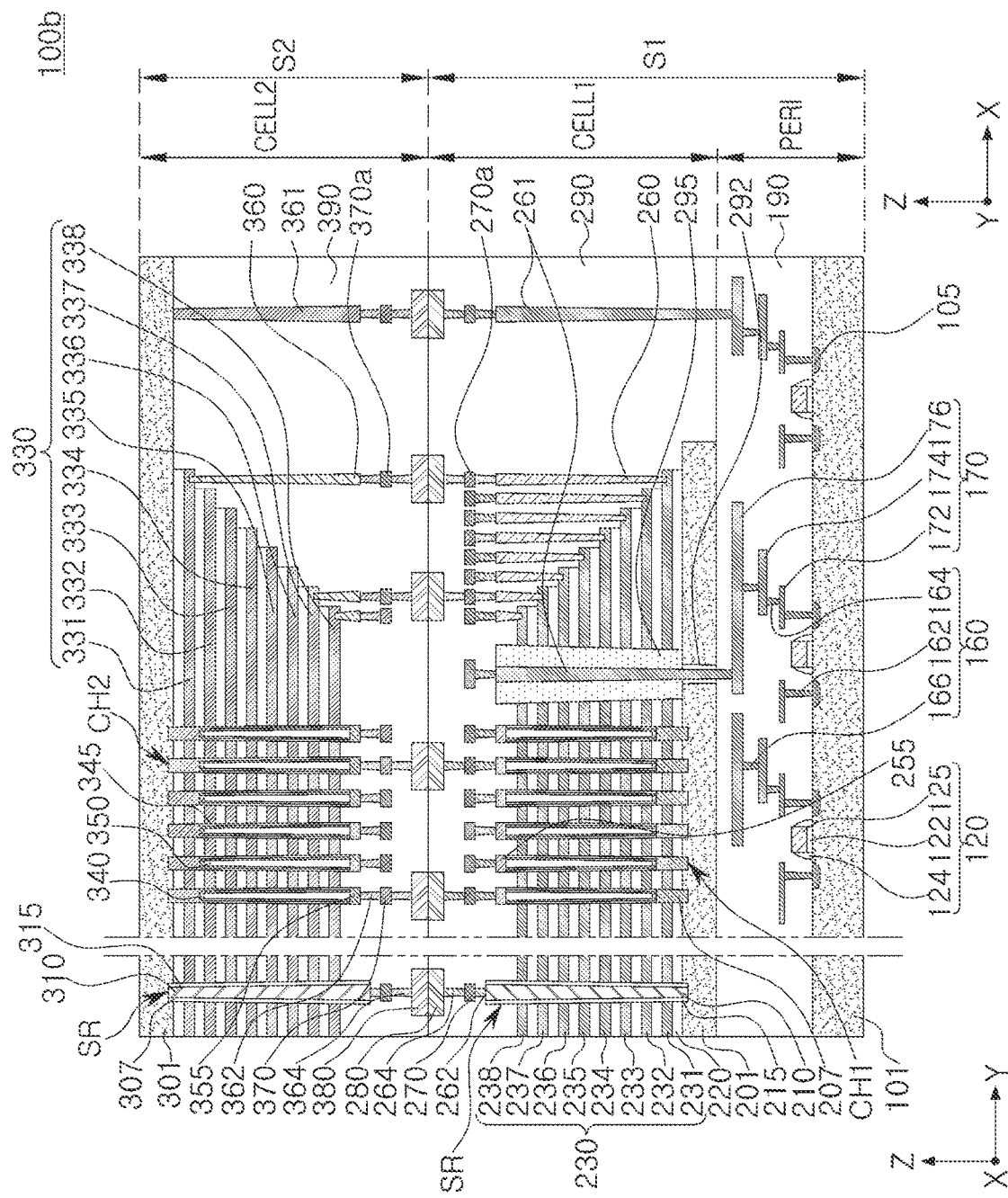

Referring to FIG. 10, a region corresponding to the gate separation region SR of FIG. 4 is illustrated together with the embodiment of FIG. 5. The first substrate structure S1 of the semiconductor device 100b may further include a first source conductive layer 210 and a first source insulating layer 215, disposed in the gate separation region SR. The second substrate structure S2 may further include a second source conductive layer 310 and a second source insulating layer 315, in a similar manner.

The first source conductive layer 210 may be insulated from the first gate electrodes 230 by the first source insulating layer 215. The first source conductive layer 210 may correspond to the first common source line CSL1 of FIGS. 2A and 2B. The first lower contact plug 262, the first bit line 270, the second lower contact plug 264, and the first bonding pad 280 are sequentially disposed on the first source conductive layer 210. Thus, by the first bonding pads 280 and the second bonding pads 380, the first source conductive layer 210, forming the first common source line CSL1, and the second source conductive layer 310, forming the second common source line CSL2, may be electrically connected to each other.

Figure 11:
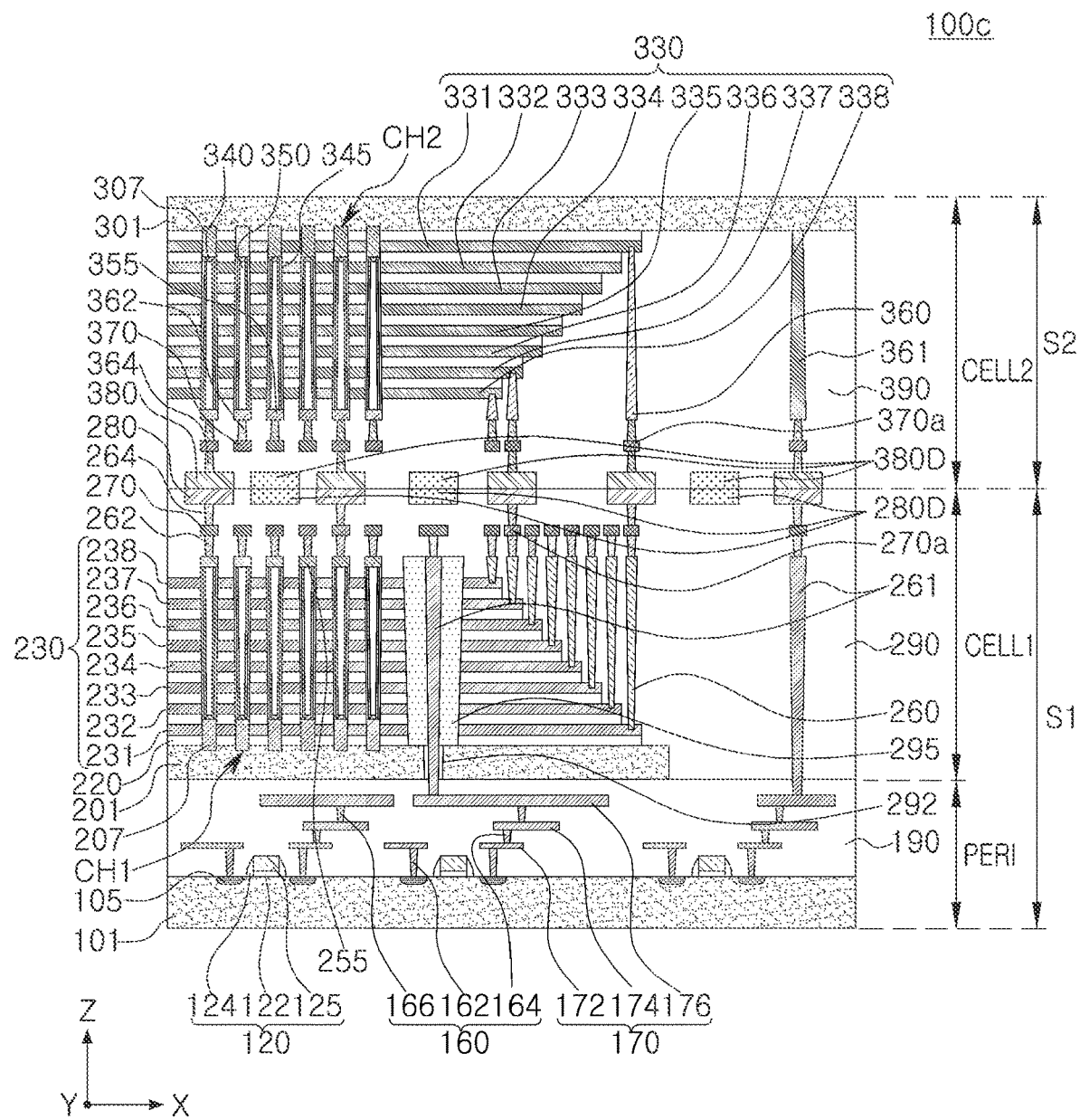

Referring to FIG. 11, the first substrate structure S1 and the second substrate structure S2 of the semiconductor device 100c may further include first dummy bonding pads 280D and second dummy bonding pads 380D, located at a level the same as a level of the first bonding pads 280 and the second bonding pads 380, and having the same or similar shape.

The first dummy bonding pads 280D and the second dummy bonding pads 380D may be disposed between the first bonding pads 280 and the second bonding pads 380, in order to enhance bonding between the first substrate structure S1 and the second substrate structures S2. According to example embodiments, the first dummy bonding pads 280D and the second dummy bonding pads 380D may have a smaller size on a plane as compared to the first bonding pads 280 and the second bonding pads 380, but are not limited thereto, and may have a size the same as or different from that of the first bonding pads 280 and the second bonding pads 380. Moreover, in example embodiments, the first dummy bonding pads 280D and the second dummy bonding pads 380D may be arranged while forming a uniform pattern together with the first bonding pads 280 and the second bonding pads 380.

The first dummy bonding pads 280D and the second dummy bonding pads 380D do not function for electrical connection. Thus, the first dummy bonding pads 280D may not be connected to second lower contact plugs 264 in a lower portion, by way of example, and a side surface and a lower surface thereof may be disposed while being completely covered by a first cell region insulating layer 290. Alternatively, each of the first dummy bonding pads 280D may not be connected to any of the second lower contact plug 264, the first lower contact plug 262, and the first bit lines 270 and 270a. The second bonding pads 380D may be disposed while being electrically insulated, in a manner similar to the description of the first dummy bonding pads 280D.

Figure 12:
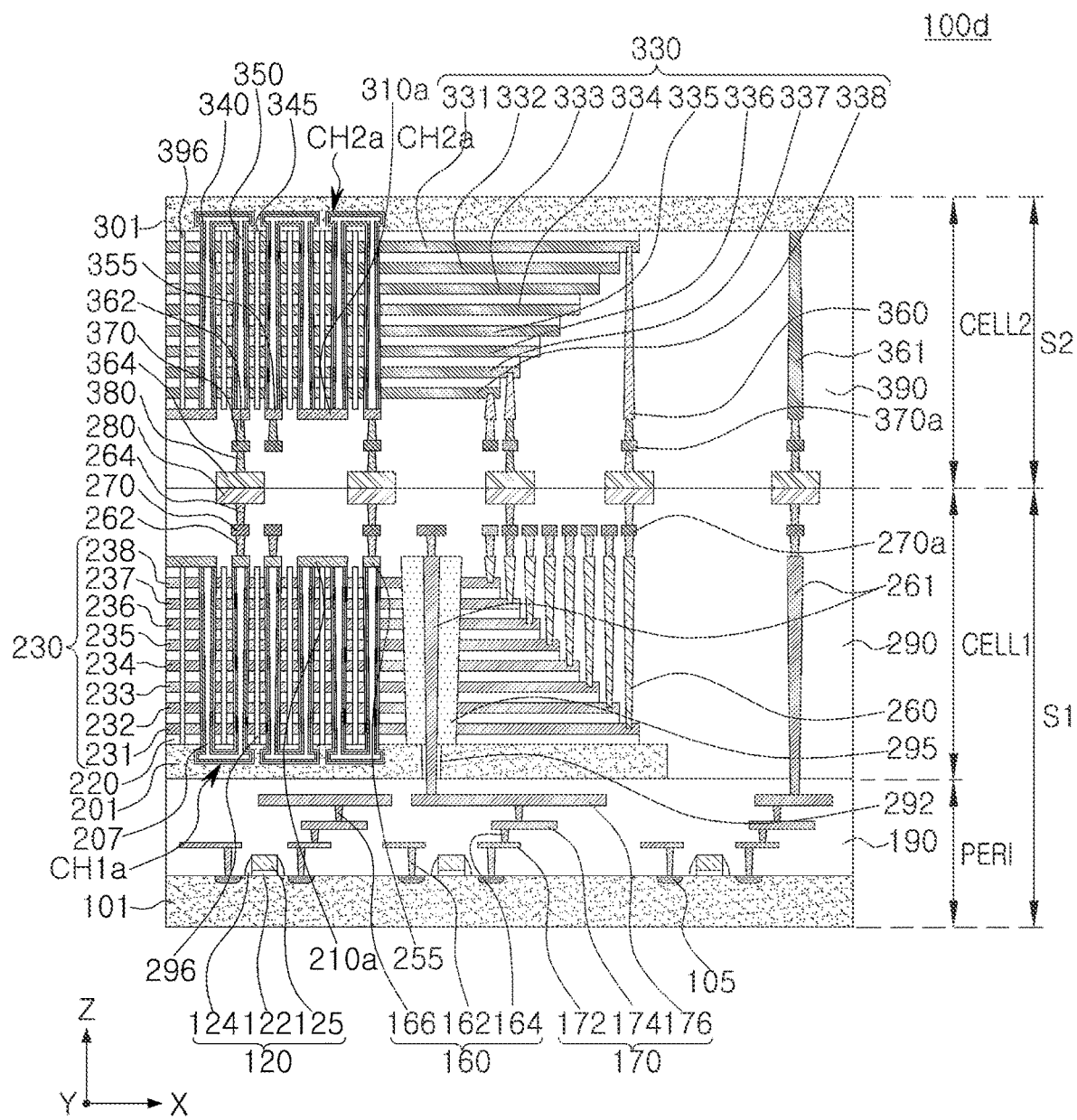

Referring to FIG. 12, in a semiconductor device 100d, first channels CH1a and second channels CH2a may have a U-shape. The first channel CH1a may pass through a stacked structure of the first gate electrodes 230 and may have a bent form in the first substrate 201. The first channel CH1a may include a first channel region 240, a first gate dielectric layer 245, a first channel insulating layer 250, and a first channel pad 255, while the first channel region 240, the first gate dielectric layer 245, and the first channel insulating layer 250 may be also disposed in the U-shape. Channel separation insulating layer 296 may be further disposed between the first channel CH1a and between portions of the first channel CH1a having a bent form. The second channels CH2a may be disposed in the U-shape, in a manner similar to the description of the first channels CH1a.

Moreover, in the semiconductor device 100d, the first source conductive layer 210a and the second source conductive layer 310a may be disposed on one side of the first channels CH1a and the second channels CH2a.

Figure 13:
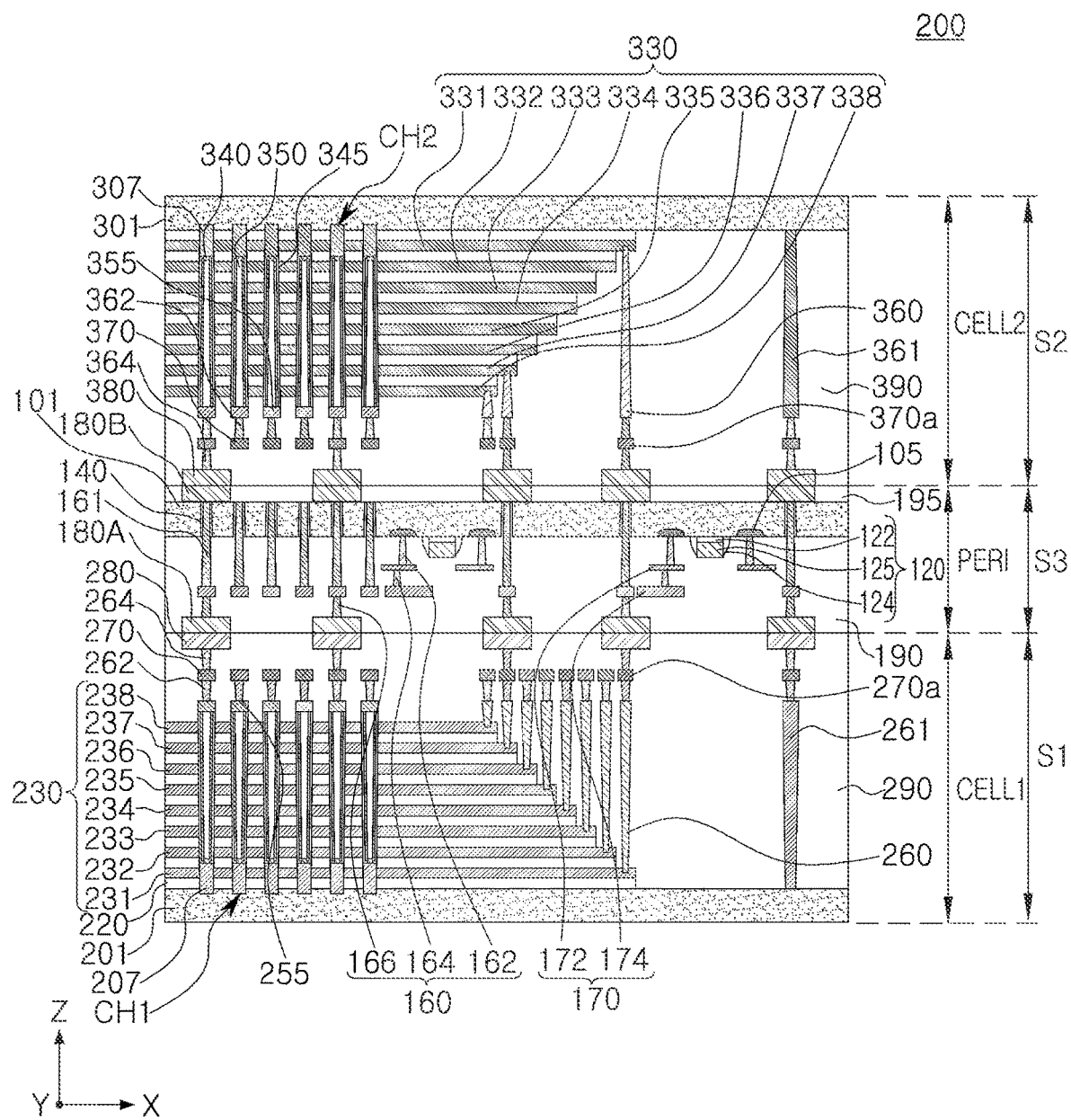
FIG. 13 is a schematic cross-sectional view of a semiconductor device according to example embodiments.

FIG. 13 is a schematic cross-sectional view of a semiconductor device according to example embodiments.

Referring to FIG. 13, the semiconductor device 200 may include a first substrate structure S1, a third substrate structure S3, and a second substrate structure S2, sequentially and vertically stacked. The first substrate structure S1 may include a first memory cell region CELL1, the third substrate structure S3 may include a peripheral circuit region PERI, and the second substrate structure S2 may include a second memory cell region CELL2.

The first memory cell region CELL1 may include a first substrate 201, first gate electrodes 230, and first channels CH1, and may include first cell contact plugs 260, a first through contact plug 261, a first lower contact plug 262, first bit lines 270 and 270a, second lower contact plugs 264, and first bonding pads 280, which are wiring structures. The second memory cell region CELL2, in a manner similar to the first memory cell region CELL1, may include a second substrate 301, second gate electrodes 330, and second channels CH2, and may include second cell contact plugs 360, a second through contact plug 361, first upper contact plugs 362, second bit lines 370 and 370a, second upper contact plugs 364, and second bonding pads 380, which are wiring structures. The description of each component may be similarly applied to the description described above with reference to FIGS. 4 and 5. However, in the case of the first substrate 201 and the second substrate 301, in a manner similar to the base substrate 101, a single crystalline layer of a semiconductor material or an epitaxial layer may be included. In the first substrate structure S1 and the second substrate structure S2, the first memory cell region CELL1 and the second memory cell region CELL2 may have a symmetrical structure based on the third substrate structure S3.

The peripheral circuit region PERI may include a base substrate 101, circuit elements 120 disposed on the base substrate 101, circuit contact plugs 160, including first to third circuit contact plugs 162, 164, and 166, and a circuit wiring line 170, including first and second circuit wiring lines 172 and 174. In detail, the peripheral circuit region PERI of the semiconductor device 200 further includes circuit through contact plugs 161 passing through a base substrate 101, as well as third bonding pads 180A and fourth bonding pads 180B exposed to an upper surface and a lower surface through a first peripheral region insulating layer 190 and a second peripheral region insulating layer 195.

The circuit through contact plugs 161 may connect the third bonding pads 180A to the fourth bonding pads 180B, disposed on both surfaces of the base substrate 101, respectively. The circuit through contact plugs 161 may pass through the base substrate 101 and a portion of the first peripheral region insulating layers 190. The circuit through contact plugs 161 may be insulated from the base substrate 101 by a substrate insulating layer 140 disposed on a portion of a side surface. The circuit through contact plugs 161 may have a shape in which a width of a lower portion is greater than a width of an upper portion, but they are not limited thereto.

The third bonding pads 180A and the fourth bonding pads 180B are disposed on both surfaces of the third substrate structure S3, respectively, and may be connected to each other through the circuit through contact plugs 161, the second circuit wiring lines 174, and the third circuit contact plugs 166. However, a structure of circuit wiring structures, disposed between the third bonding pads 180A and the fourth bonding pads 180B may be variously changed in example embodiments. The fourth bonding pads 180B may be disposed to be in contact with an upper surface of the base substrate 101. The third bonding pads 180A and the fourth bonding pads 180B may include, for example, copper (Cu).

The third bonding pads 180A may be bonded to the first bonding pads 280 of the first substrate structure S1, and the fourth bonding pads 180B may be bonded to the second bonding pads 380 of the second substrate structure S2. Thus, the third bonding pads 180A are electrically connected to the first bit lines 270 and the first cell contact plugs 260, and the fourth bonding pads 180B may be electrically connected to the second bit lines 370 and the second cell contact plugs 360. Thus, the first substrate structure S1, the second substrate structure S2, and the third substrate structure S3 may be electrically connected to each other through the third bonding pads 180A and the fourth bonding pads 180B.

The first bit lines 270 and the second bit lines 370 of the first substrate structure S1 and the second substrate structure S2 may be physically and electrically connected through a second lower contact plug 264, first bonding pads 280 and third bonding pads 180A, third circuit contact plugs 166, second circuit wiring lines 174, circuit through contact plugs 161, fourth bonding pads 180B and second bonding pads 380, and a second upper contact plug 364. At least a portion of the first gate electrodes 230 and the second gate electrodes 330 of the first substrate structure S1 and the second substrate structure S2 may be electrically connected to each other. In detail, the first gate electrodes 230 and the second gate electrodes 330 may be physically and electrically connected to each other, through a first cell contact plug 260, a first lower contact plug 262, a first bit line 270a, a second lower contact plug 264, first bonding pads 280 and third bonding pads 180A, third circuit contact plugs 166, second circuit wiring lines 174, circuit through contact plugs 161, fourth bonding pads 180B and second bonding pads 380, a second upper contact plug 364, a second bit line 370a, a first upper contact plug 362, and a second cell contact plug 360.

FIGS. 14A to 14H are schematic cross-sectional views illustrating a method for manufacturing a semiconductor device according to example embodiments. FIGS. 14A to 14H illustrate a region corresponding to FIG. 5.

Figure 14A:
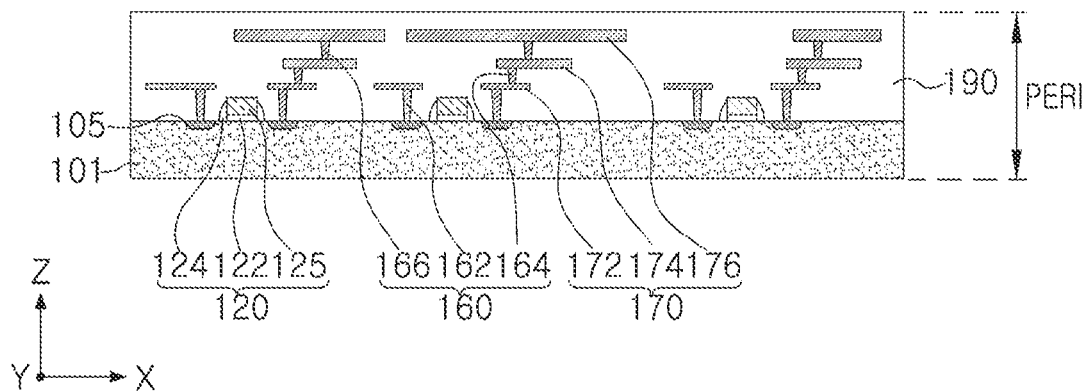
FIGS. 14A to 14H are schematic cross-sectional views illustrating a method for manufacturing a semiconductor device according to example embodiments.

Referring to FIG. 14A, circuit elements 120 and circuit wiring structures are formed on the base substrate 101, thereby forming a peripheral circuit region PERI.

First, a circuit gate dielectric layer 122 and a circuit gate electrode 125 may be sequentially formed on the base substrate 101. The circuit gate dielectric layer 122 and the circuit gate electrode 125 may be formed using atomic layer deposition (ALD) or chemical vapor deposition (CVD). The circuit gate dielectric layer 122 may be formed of silicon oxide, and the circuit gate electrode layer 125 may be formed of at least one of polycrystalline silicon or metal silicide, but an example embodiment is not limited thereto. Then, the spacer layer 124 and the source/drain regions 105 may be formed on both side walls of the circuit gate dielectric layer 122 and the circuit gate electrode 125. According to example embodiments, the spacer layer 124 may be formed of a plurality of layers. Then, the source/drain regions 105 may be formed by performing an ion implantation process.

The circuit contact plugs 160 of the circuit wiring structures may be provided by forming a portion of the peripheral region insulating layer 190, etching and removing a portion and embedding a conductive material. The circuit wiring lines 170 may be provided by depositing and patterning a conductive material, by way of example.

The peripheral region insulating layer 190 may be formed of a plurality of insulating layers. The peripheral region insulating layer 190 may be ultimately provided to cover the circuit elements 120 and the circuit wiring structures, by forming a portion in respective operations for formation of the circuit wiring structures and forming a portion in an upper portion of the third circuit wiring line 176.

Figure 14B:
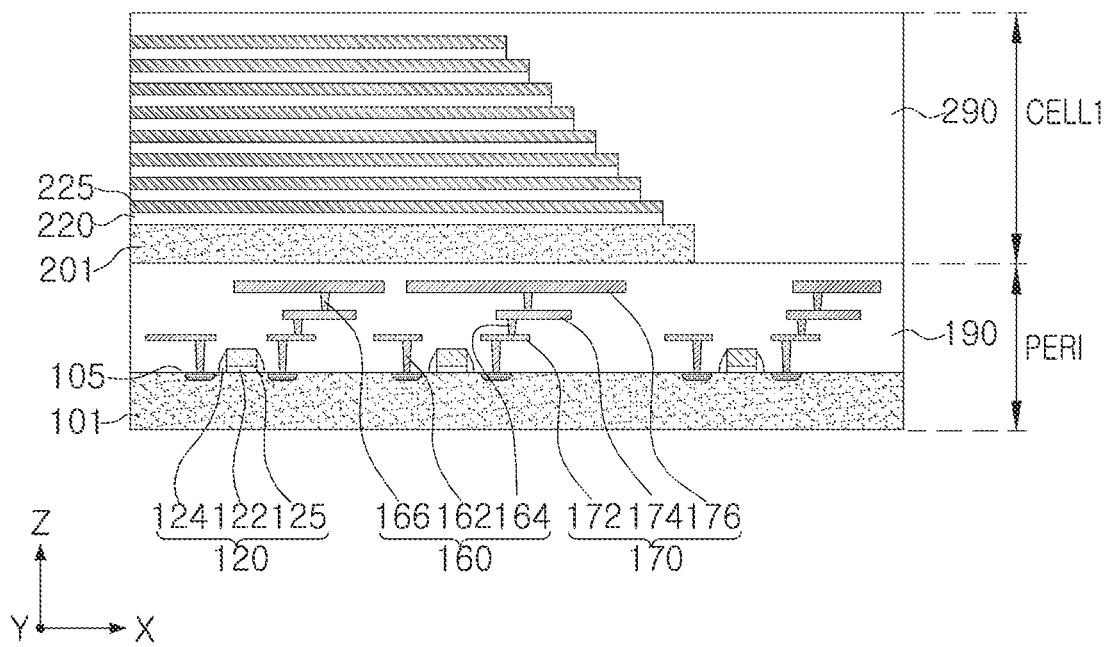

Referring to FIG. 14B, for formation of the first memory cell region CELL1, a first substrate 201 may be formed in an upper portion of the peripheral region insulating layer 190. Then, sacrificial layers 225 and first interlayer insulating layers 220 are alternately stacked on the first substrate 201, and a portion of the sacrificial layers 225 and the first interlayer insulating layers 220 may be removed to allow the sacrificial layers 225 to be extended by different lengths.

The first substrate 201 may be formed on the peripheral region insulating layer 190. The first substrate 201 may be formed of polycrystalline silicon, for example, and may be formed using a CVD process. The polycrystalline silicon, forming the first substrate 201, may contain an impurity. The first substrate 201 may be formed smaller than the base substrate 101, but is not limited thereto.

The sacrificial layers 225 may be a layer to be replaced with first gate electrodes 230 through a subsequent process. The sacrificial layers 225 may be formed of a material to be etched with etching selectivity for the first interlayer insulating layers 220. For example, the first interlayer insulating layer 220 may include at least one of silicon oxide and silicon nitride, and the sacrificial layers 225 may include a material selected from silicon, silicon oxide, silicon carbide, and silicon nitride, different from that of the first interlayer insulating layer 220. In example embodiments, all of thicknesses of the first interlayer insulating layers 220 may not be the same.

Then, in order to allow sacrificial layers 225 in an upper portion to be extended less than sacrificial layers 225 in a lower portion, a photolithography process and an etching process for the sacrificial layers 225 and the first interlayer insulating layers 220 may be repeatedly performed. Thus, the sacrificial layers 225 may have a stepped form. In example embodiments, the sacrificial layers 225 may be formed to have a relatively thick thickness at an end portion (e.g., in the Z-direction), and a process therefor may be further performed. Then, a first cell region insulating layer 290 covering an upper portion of a stacked structure of the sacrificial layers 225 and the first interlayer insulating layers 220 may be provided.

Figure 14C:
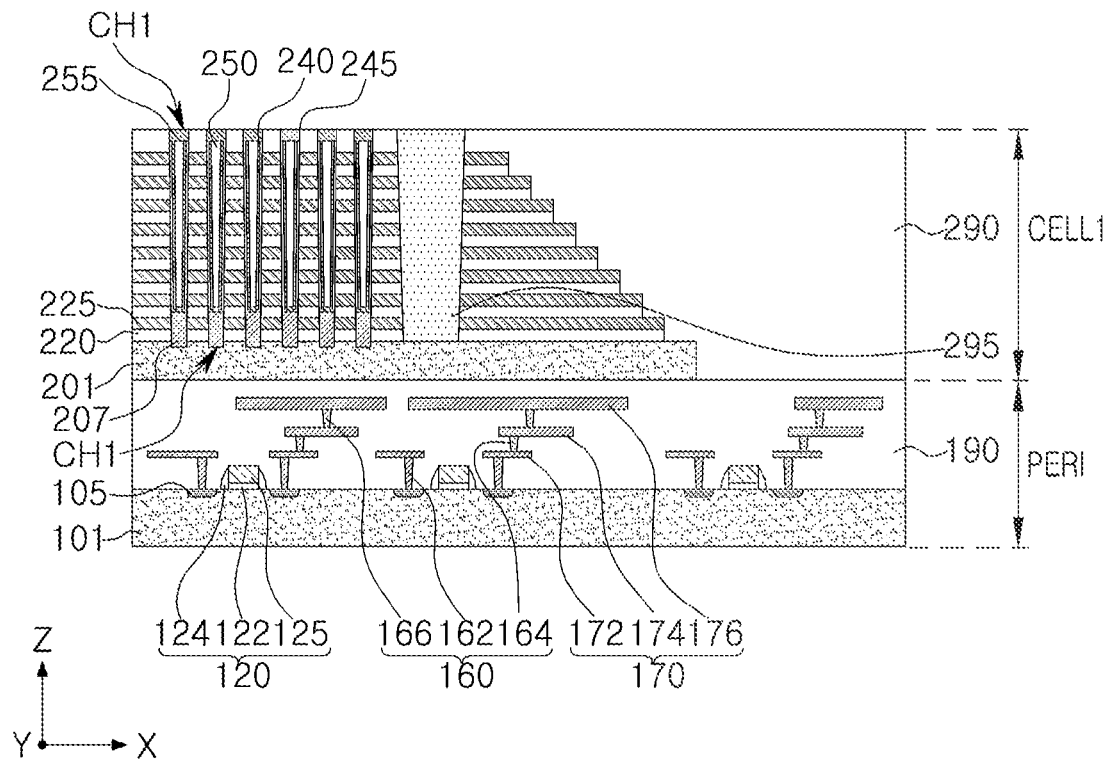

Referring to FIG. 14C, a through wiring insulating layer 295 and first channels CH1, passing through a stacked structure of the sacrificial layers 225 and the first interlayer insulating layers 220, are provided.

The through wiring insulating layer 295 may be formed by forming an opening by removing a portion of the sacrificial layers 225 and the first interlayer insulating layers 220 using a mask pattern, and depositing an insulating material filling the opening. According to example embodiments, during formation of the opening, a portion of the first substrate 201 may be recessed.

For formation of the first channels CH1, first, the stacked structure may be anisotropically etched to form channel holes. Due to a height of the stacked structure, a side wall of the channel holes may not be perpendicular to an upper surface of the first substrate 201, and so the channel holes and first channels CH1 may have a tapered shape that tapers toward the first substrate 201. In example embodiments, the channel holes may be formed to recess a portion of the first substrate 201.

Then, the first epitaxial layer 207, the first channel region 240, the first gate dielectric layer 245, the first channel insulating layer 250, and the first channel pads 255 are formed in the channel holes, thereby forming the first channels CH1. The first epitaxial layer 207 may be formed using a selective epitaxial growth (SEG) process. The first epitaxial layers 207 may include a single layer or a plurality of layers. The first epitaxial layers 207 may contain polycrystalline silicon (Si), monocrystalline Si, polycrystalline germanium (Ge) or monocrystalline Ge that are doped with or do not include an impurity. The first gate dielectric layer 245 may be formed to have a uniform thickness using ALD or CVD. In the operation described above, at least a portion, vertically extended along the first channel region 240, of the first gate dielectric layer 245, may be provided. The first channel region 240 may be formed on the first gate dielectric layer 245 in the first channels CH1. The first channel insulating layer 250 may be formed to fill the first channels CH1, and may be an insulating material. However, according to example embodiments, rather than the first channel insulating layer 250, a conductive material may fill a space of the first channel region 240. The first channel pads 255 may be formed of a conductive material, for example, polycrystalline silicon.

Figure 14D:
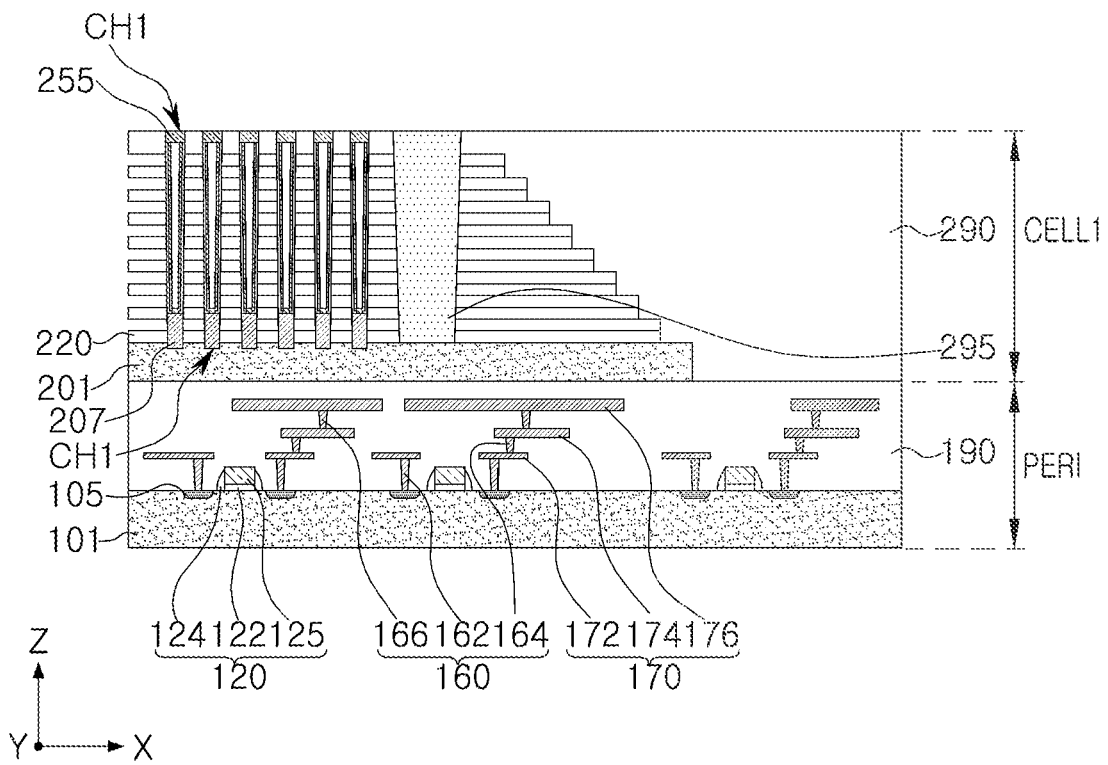

Referring to FIG. 14D, openings, passing through a stacked structure of the sacrificial layers 225 and the first interlayer insulating layers 220, are provided, and the sacrificial layers 225 may be removed through the openings.

The openings may be provided in the form of a trench, extended in the X-direction in a region, not illustrated. The sacrificial layers 225 may be removed selectively with respect to the first interlayer insulating layers 220, using, for example, wet etching. Thus, a portion of side walls of the first channels CH1 and the through wiring insulating layer 295 may be exposed between the first interlayer insulating layers 220.

Figure 14E:
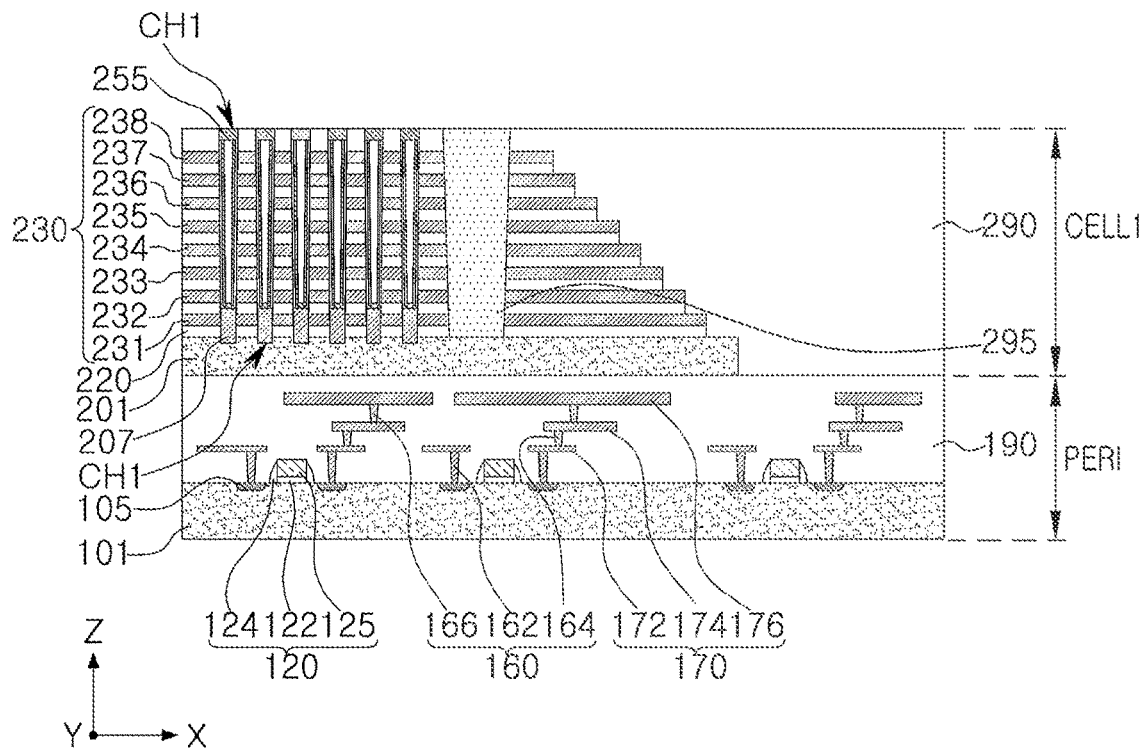

Referring to FIG. 14E, first gate electrodes 230 may be provided in a region from which the sacrificial layers 225 are removed.

A conductive material is embedded in the region, from which the sacrificial layers 225 are removed, to provide the first gate electrodes 230. The first gate electrodes 230 may contain metal, polycrystalline silicon or metal silicide material. In example embodiments, before the first gate electrodes 230 are provided, when a region, horizontally extending on the first substrate 201 along the first gate electrodes 230, of the first gate dielectric layer 245, is provided, the region described above may be provided first.

Then, in a region not illustrated, in a manner similar to an example embodiment of FIG. 10, first source insulating layers 215 and first source conductive layers 210 may be provided in the openings. The first source insulating layers 215 may be provided in the form of a spacer, by forming an insulating material and removing the insulating material from the first substrate 201 to allow an upper surface of the first substrate 201 to be exposed. The first source conductive layer 210 may be formed by depositing a conductive material between the first source insulating layers 215. The first gate electrodes 230 may be spaced apart from each other by a predetermined distance in the Y-direction by the first source insulating layers 215 and the first source conductive layer 210. However, formation of the first source conductive layers 210 is not necessary, and may be omitted according to example embodiments. In this case, a layer serving a function of a source conductive layer may be formed in the first substrate 201.

Figure 14F:
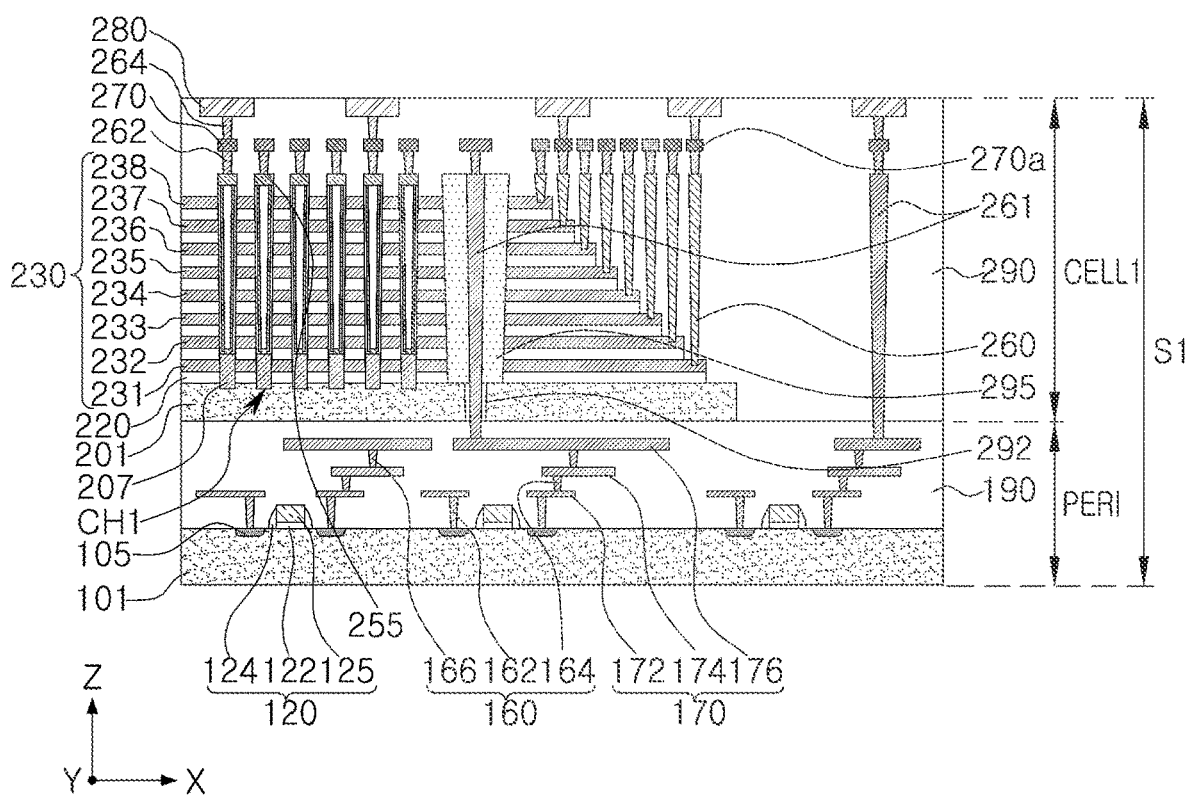

Referring to FIG. 14F, the first cell contact plugs 260, the first through contact plugs 261, the first lower contact plugs 262, the first bit lines 270 and 270a, the second lower contact plugs 264, and the first bonding pads 280, which are wiring structures, may be provided on the first gate electrodes 230.

The first cell contact plugs 260 may be formed by etching the first cell region insulating layer 290 to form a contact hole on contact regions CP, and embedding a conductive material. Then, an insulating layer, forming the first cell region insulating layer 290 while covering an upper surface of the first cell contact plugs 260, may be provided. Each of the first cell contact plugs 260 may be continuously formed pillars extending between first lower contact plugs 262 and a respective gate electrode 230.

The first through contact plugs 261 may be provided by forming a through hole passing through the through wiring insulating layer 295 and the first substrate 201, forming a side insulating layer 292 on an exposed side wall of the first substrate 201, and then depositing a conductive material. The first lower contact plugs 262 may be formed by etching the first cell region insulating layer 290 and depositing a conductive material on the first channel pads 155, the first cell contact plugs 260, and the first through contact plugs 261. Each of the first through contact plugs 261 may be continuously formed pillars extending between first lower contact plugs 262 and peripheral region insulating layer 190, and may have a length longer than the stack of first gate electrodes 230 in the Z-direction.

The first bit lines 270 and 270a may be formed through deposition and patterning processes of a conductive material, or by forming a single layer, an insulating layer forming the first cell region insulating layer 290, and then patterning it and depositing a conductive material. The second lower contact plugs 264 may be formed by etching the first cell region insulating layer 290 and depositing a conductive material on the first bit lines 270 and 270a.

The first bonding pads 280 may be formed through, for example, deposition and patterning processes of a conductive material on the second lower contact plugs 264. An upper surface of the first bonding pads 280 may be exposed through the first cell region insulating layer 290, and the first bonding pads may form a portion of an upper surface of the first substrate structure S1. According to example embodiments, the upper surface of the first bonding pads 280 may be provided in the form further protruding upwardly, as compared to an upper surface of the first cell region insulating layer 290. However, in some embodiments, the upper surface of the first bonding pads 280 is provided to be coplanar with an upper surface of the first cell region insulating layer 290. Due to the operation described above, a first memory cell region CELL1 is completed, and the first substrate structure S1 may be ultimately prepared.

Figure 14G:
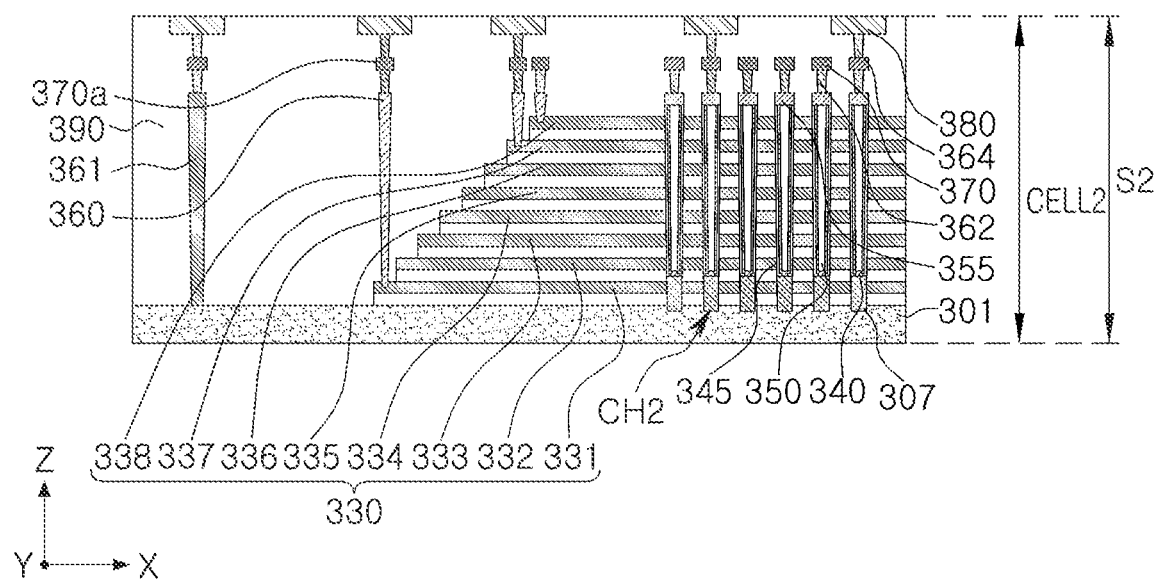

Referring to FIG. 14G, the second substrate structure S2 may be provided.

The second substrate structure S2 may be manufactured using operations the same as those of the first memory cell region CELL1 of the first substrate structure S1, described above with reference to FIGS. 14B to 14F.

According to example embodiments, the first bit lines 270 and the second bit lines 370 are provided after formation of the first gate electrodes 230 and the second gate electrodes 330. Thus, even when the first bit lines 270 and the second bit lines 370 are formed of a material, relatively vulnerable to a high-temperature process, for example, copper (Cu), the bit lines may be formed without restriction of a process.

Figure 14H:
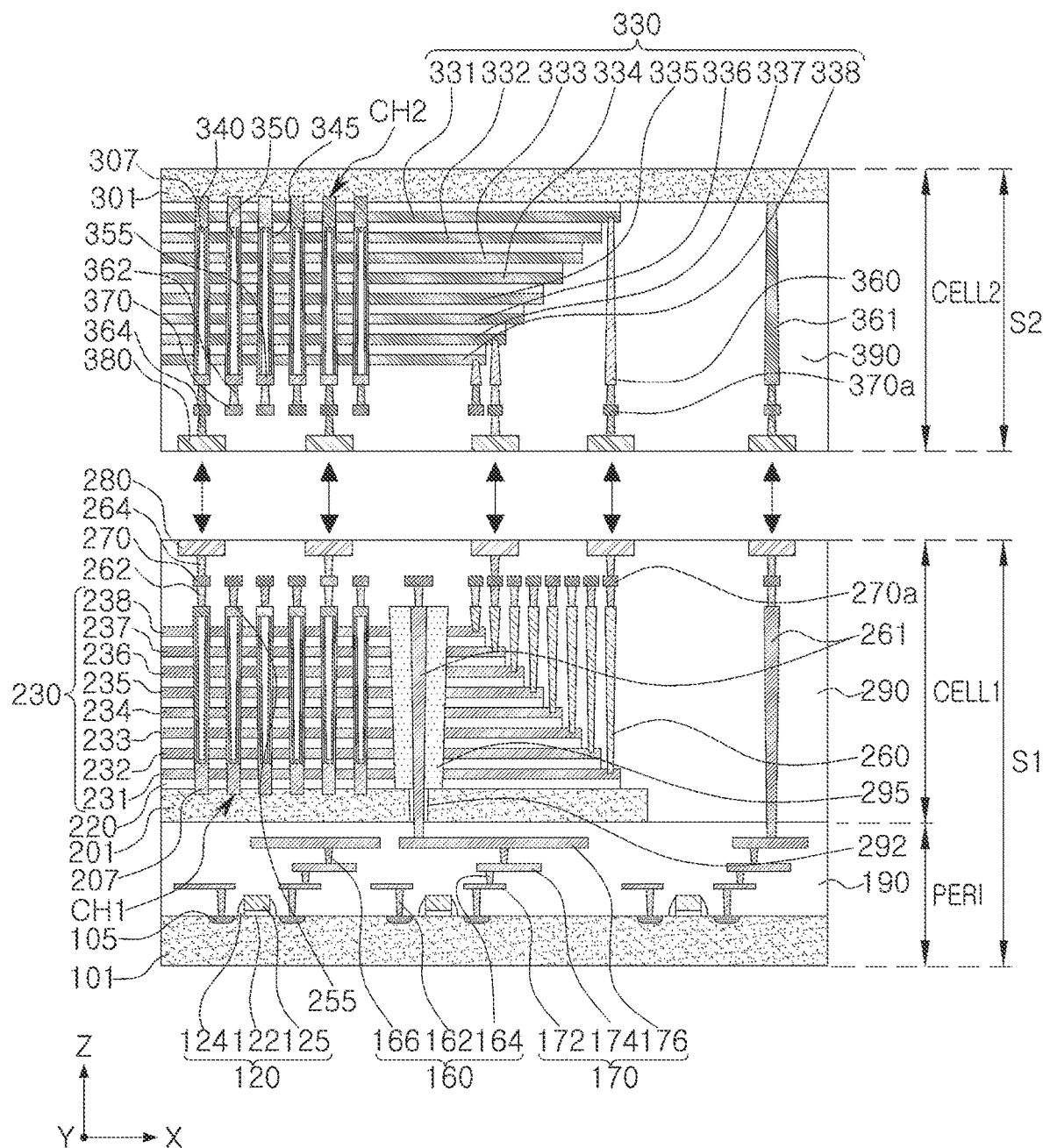

Referring to FIG. 14H, the second substrate structure S2 may be bonded to the first substrate structure S1.

The first substrate structure S1 and the second substrate structure S2 may be connected to each other by bonding the first bonding pads 280 and the second bonding pads 380, for example by applying a pressure. The second substrate structure S2 may be bonded to the first substrate structure S1 by inverting the second substrate structure to allow the second bonding pads 380 to face downwardly. The first substrate structure S1 and the second substrate structure S2 may be directly bonded without intervention of an adhesive such as a separate adhesive layer. For example, bonding of the first bonding pads 280 and the second bonding pads 380 at an atomic level may be provided by applying a pressure as described above. In this manner, the first bonding pads 280 and the second bonding pads 380 contact each other. According to example embodiments, before bonding, in order to enhance a bonding force, a surface treatment process such as a hydrogen plasma treatment may be further performed on an upper surface of the first substrate structure S1 and a lower surface of the second substrate structure S2.

In example embodiments, as illustrated in FIGS. 7B and 8B, when the bonding dielectric layer 293 is disposed in an upper portion of the first cell region insulating layer 290 and the second substrate structure S2 also has the same layer, a bonding force may be further secured due to not only bonding between the first bonding pads 280 and the second bonding pads 380, but also dielectric bonding between the bonding dielectric layer 293 and a bonding dielectric layer disposed thereon. In this manner, the bonding dielectric layer 293 of the first substrate structure S1 contacts the bonding dielectric layer 293 of the second substrate structure S2. Due to the bonding process described above, the semiconductor device 100 of FIG. 5 may be ultimately manufactured.

FIGS. 15A to 15G are schematic cross-sectional views illustrating a method for manufacturing a semiconductor device according to example embodiments. FIGS. 15A to 15G illustrate a region corresponding to FIG. 13.

Figure 15A:
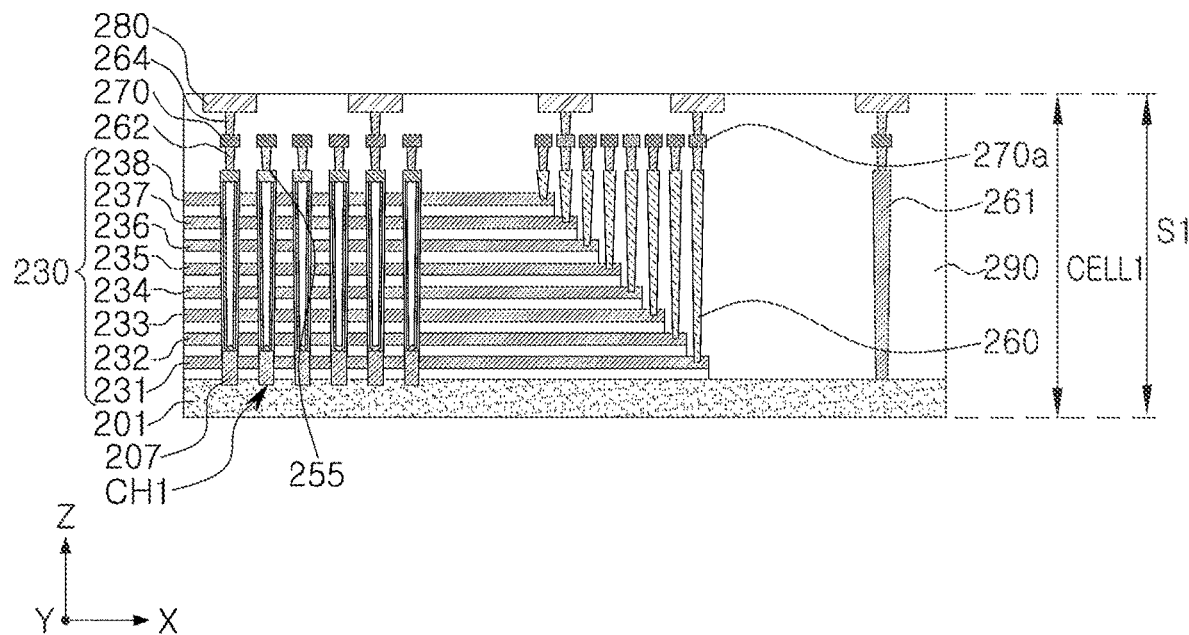
FIGS. 15A to 15G are schematic cross-sectional views illustrating a method for manufacturing a semiconductor device according to example embodiments.

Referring to FIG. 15A, a first substrate structure S1 may be provided.

The first substrate structure S1 may be manufactured by forming the first memory cell region CELL1, by performing operations the same as those described above with reference to FIGS. 14B to 14F.

Figure 15B:
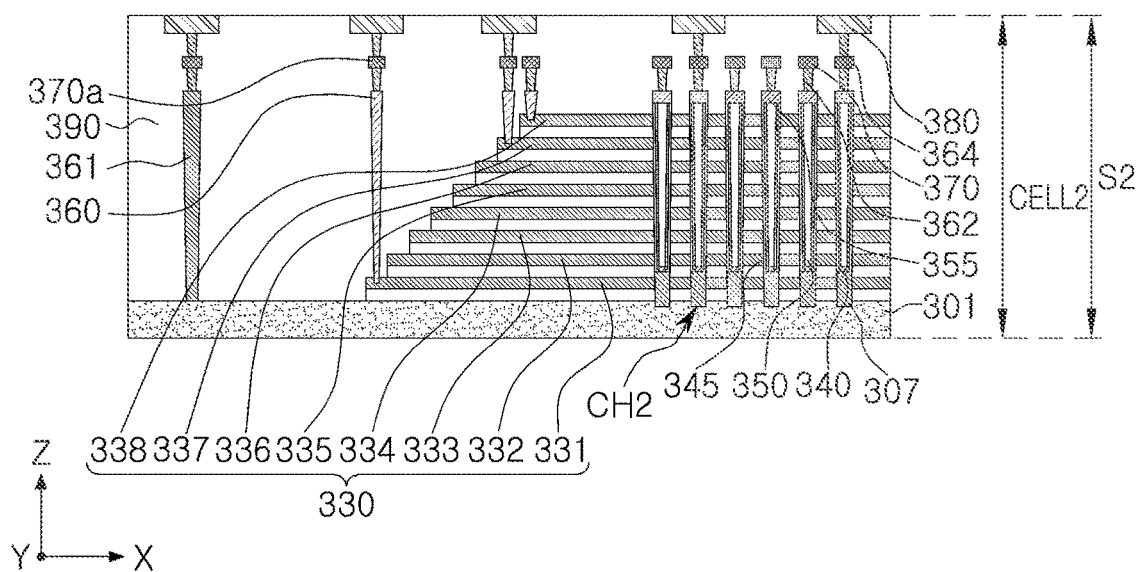

Referring to FIG. 15B, a second substrate structure S2 may be provided.

The second substrate structure S2 may also be manufactured by forming the second memory cell region CELL2, by performing operations the same as those described above with reference to FIGS. 14B to 14F.

Figure 15C:
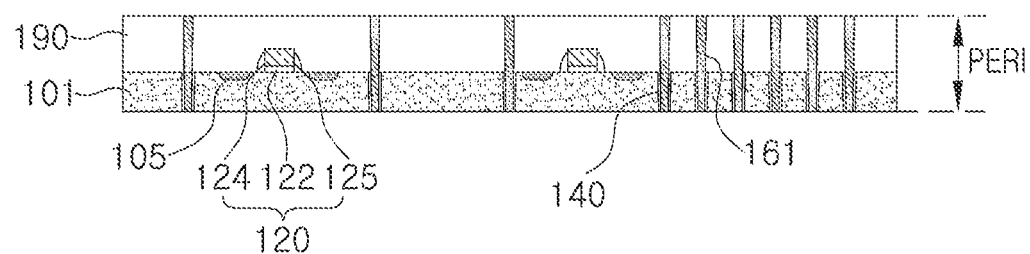

Referring to FIG. 15C, for formation of the third substrate structure S3 including the peripheral circuit region PERI, circuit elements 120 and circuit through contact plugs 161 may be provided on the base substrate 101.

The circuit elements 120 may be formed using operations the same as described with reference to FIG. 14A. After the circuit elements 120 are provided, a first peripheral region insulating layer 190 may be formed on the circuit elements 120.

Forming the circuit through contact plugs 161 may include forming contact holes by removing a portion of the first peripheral region insulating layer 190 and the base substrate 101 from an upper surface of the first peripheral region insulating layer 190. Then, a substrate insulating layer 140 may be formed on a side wall and a lower surface of the base substrate 101, having been exposed through the contact holes. Then, a conductive material is embedded in the contact holes to provide the circuit through contact plugs 161.

Figure 15D:
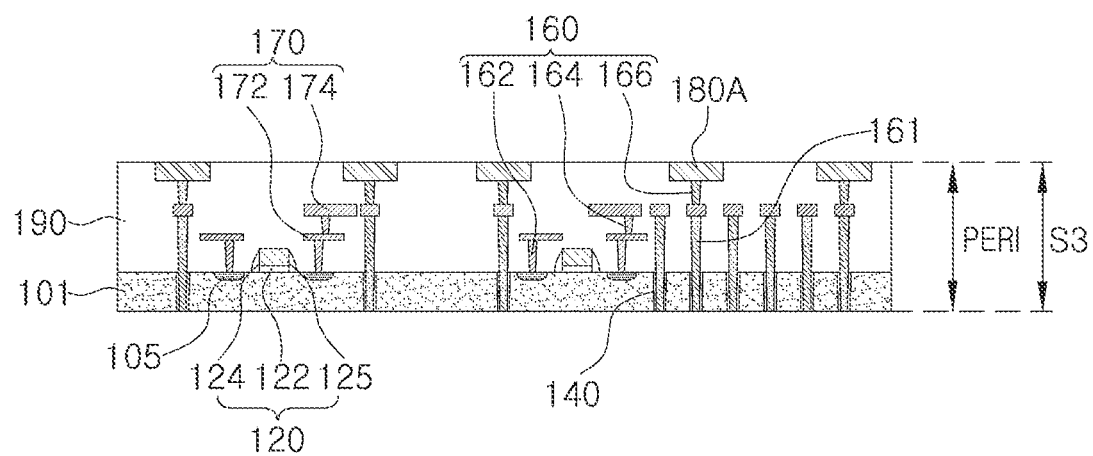

Referring to FIG. 15D, circuit wiring structures forming the peripheral circuit region PERI may be provided.

The circuit contact plugs 160 of the circuit wiring structures may be provided by forming a portion of the first peripheral region insulating layer 190, etching and removing a portion and embedding a conductive material. The circuit wiring lines 170 may be provided by depositing and patterning a conductive material, by way of example. Then, third bonding pads 180A may be formed on the second circuit contact plugs 164.

Figure 15E:
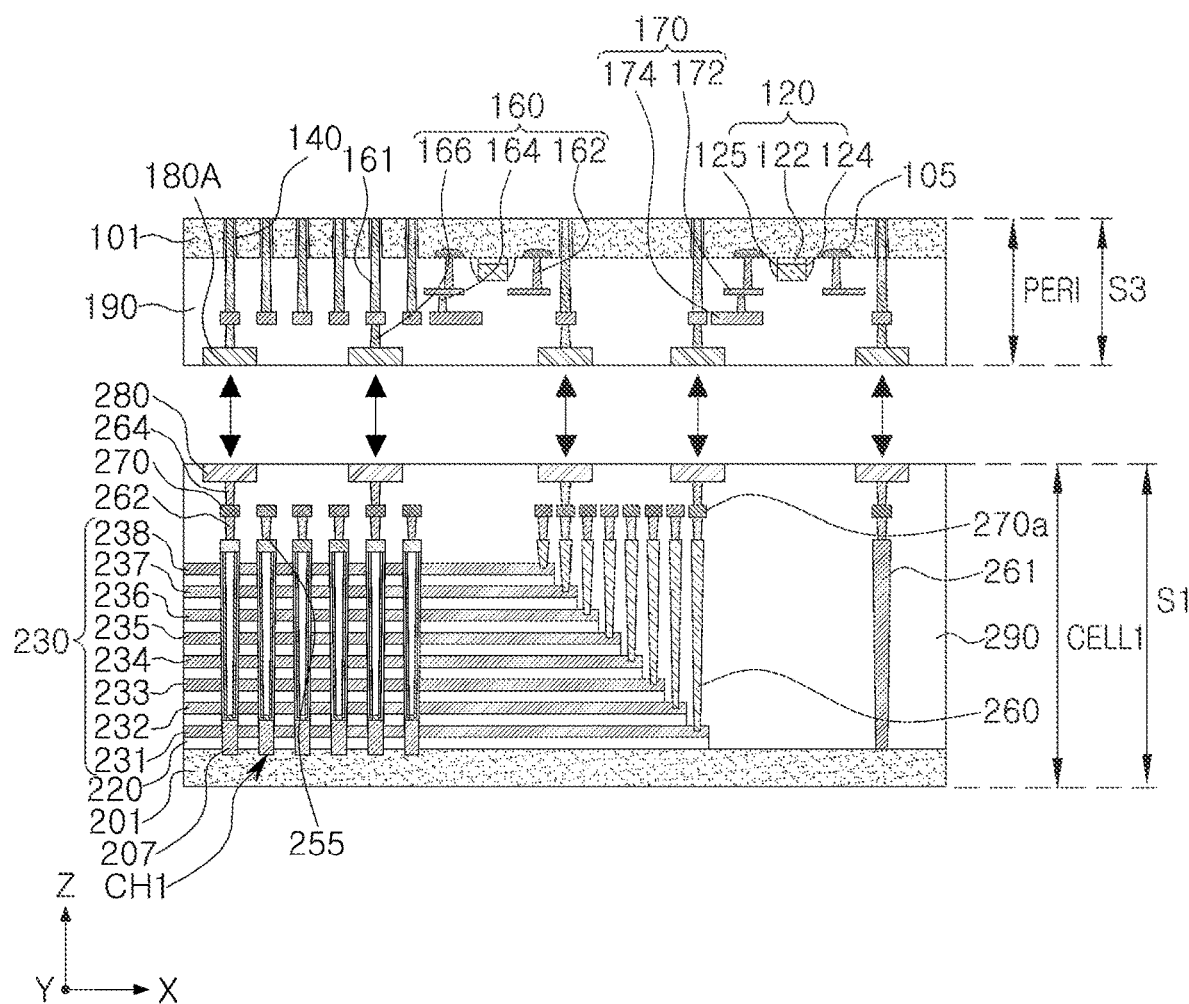

Referring to FIG. 15E, the third substrate structure S3 may be bonded to the first substrate structure S1.

The first substrate structure S1 and the third substrate structure S3 may be connected to each other by bonding the first bonding pads 280 and the third bonding pads 180A by applying a pressure. The third substrate structure S3 in an inverted form may be bonded to the first substrate structure S1 to allow the base substrate 101 to face upwardly. The first substrate structure S1 and the third substrate structure S3 may be directly bonded without intervention of an adhesive such as a separate adhesive layer. In example embodiments, as illustrated in FIGS. 7B and 8B, when the bonding dielectric layer 293 is disposed in an upper portion of the first cell region insulating layer 290 and the third substrate structure S3 also has the same dielectric layer, a bonding force may be further secured due to dielectric bonding.

Figure 15F:
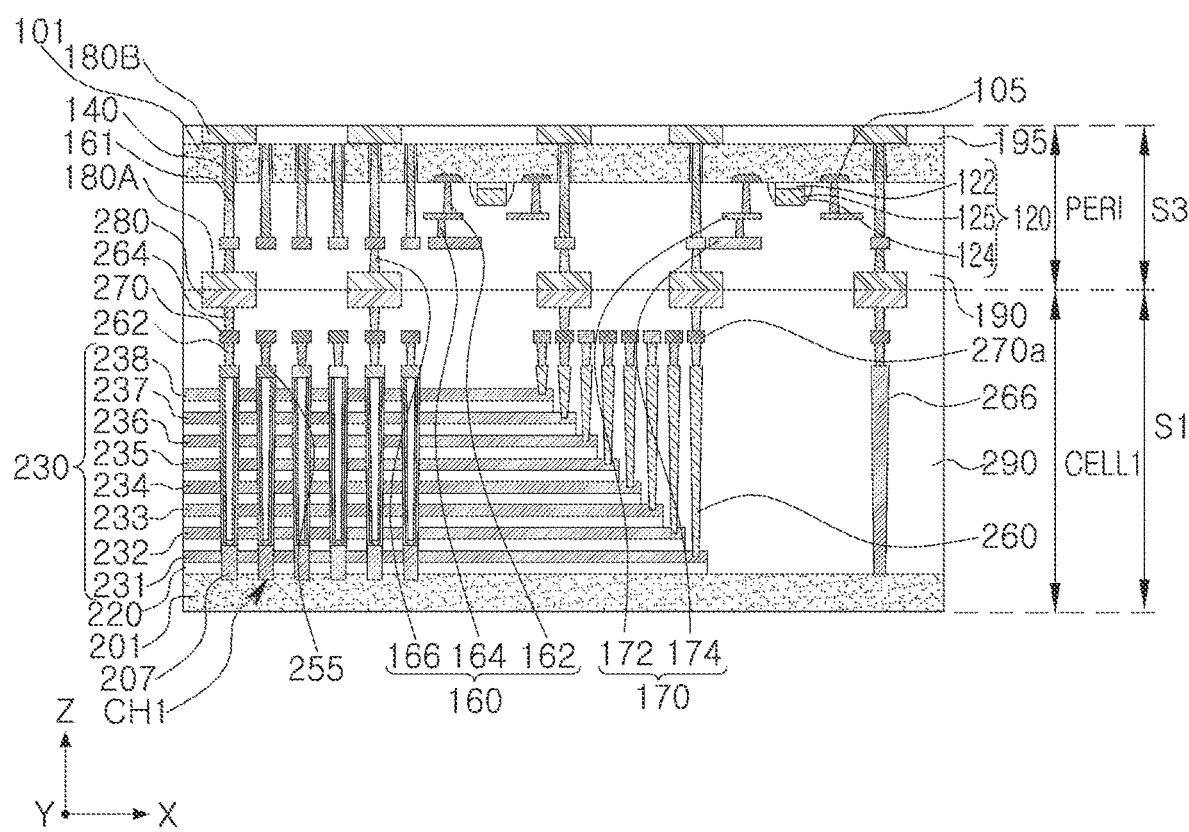

Referring to FIG. 15F, the base substrate 101 is removed by a predetermined thickness from an unbonded surface of the base substrate 101, that is, an upper surface of a bonding structure of the first substrate structure S1 and the third substrate structure S3, to form the third bonding pads 180B.

A portion of the base substrate 101 may be removed to expose the circuit through contact plugs 161 using a grinding process, a planarization process, or the like. During the removal process, the substrate insulating layer 140, a bottom surface of the circuit through contact plugs 161, having been formed on an upper surface in the FIG. 15F, may be removed. Then, third bonding pads 180B may be formed on the circuit through contact plugs 161. A second peripheral region insulating layer 195, surrounding the third bonding pads 180B, may be provided. However, according to example embodiments, the second peripheral region insulating layer 195 may be provided first before the third bonding pads 180B are provided.

Figure 15G:
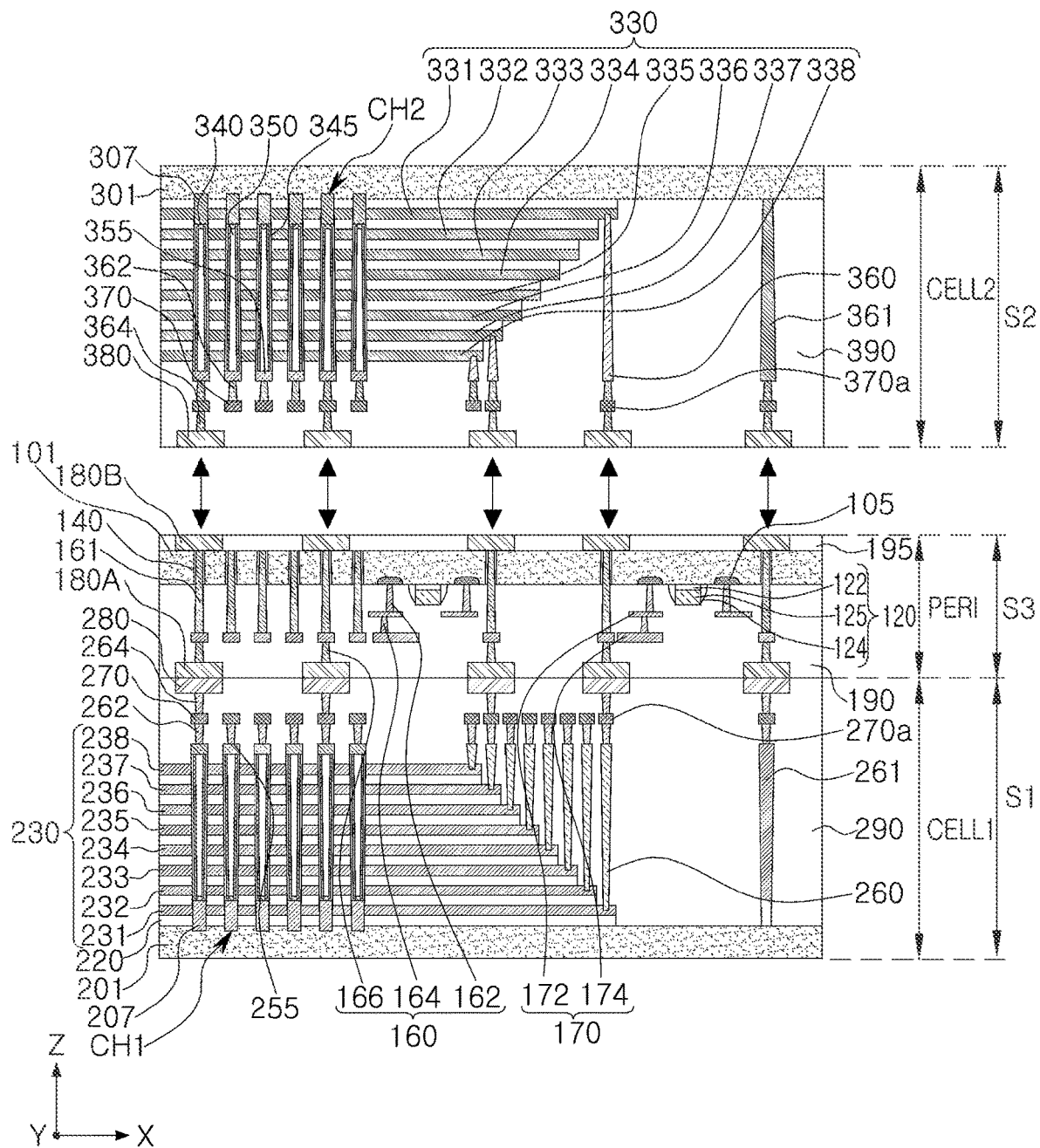

Referring to FIG. 15G, the second substrate structure S2 may be bonded to a bonding structure the first substrate structure S1 and the third substrate structure S3.

The bonding structure the first substrate structure S1 and the third substrate structure S3, and the second substrate structure S2 may be connected to each other by bonding the fourth bonding pads 180B and the second bonding pads 380 by applying a pressure. The second substrate structure S2 in an inverted form may be bonded to the bonding structure the first substrate structure S1 and the third substrate structure S3, to allow the second substrate 301 to face upwardly. The third substrate structure S3, of the bonding structure the first substrate structure S1 and the third substrate structure S3, and the second substrate structure S2 may be directly bonded without intervention of an adhesive such as a separate adhesive layer. In example embodiments, the second structure S2 and the third structure S3 may have a bonding dielectric layer on a bonding surface. In this case, a bonding force may be further secured by dielectric bonding.

Due to the bonding process described above, the semiconductor device 200 of FIG. 13 may be ultimately manufactured.

Though not shown in FIG. 5 or 13, one or more of the external-facing surfaces of the semiconductor substrates facing away from the semiconductor device 100 or 200 may include external connection terminals thereon (e.g., solder bumps or balls) that connect to circuitry within the semiconductor substrate to allow electrical communication between the internal circuitry of the semiconductor device 100 or 200 and a device outside of the semiconductor device. For example, the semiconductor device 100 or 200 may be described as a semiconductor chip, which may be a part of a semiconductor package, for example, that includes a package substrate connected to the semiconductor chip by using the external connection terminals.

Figure 16:
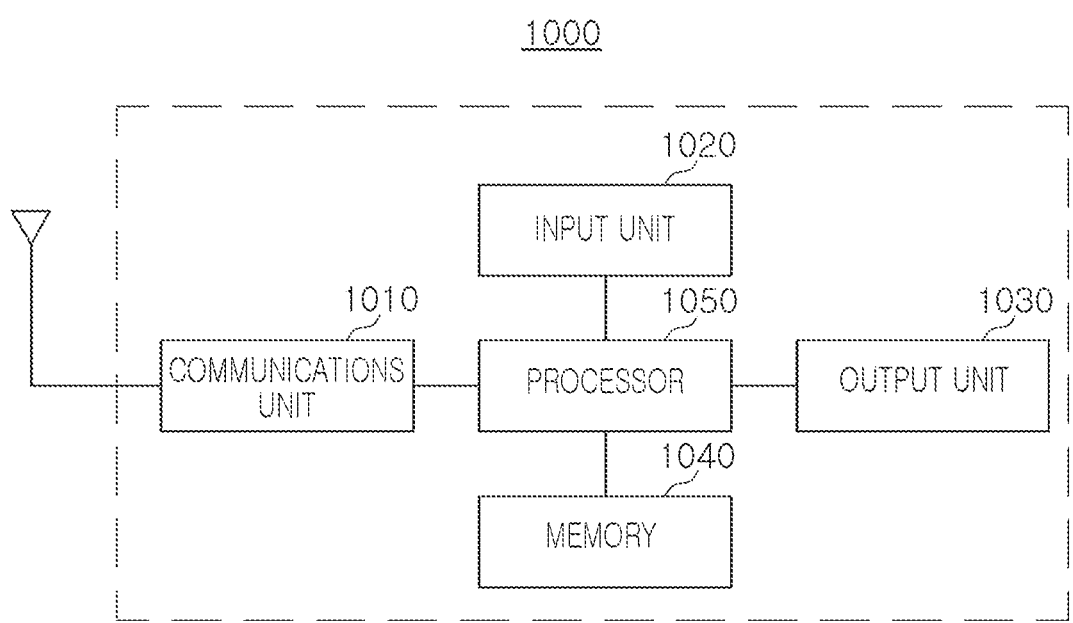
FIG. 16 is a block diagram illustrating an electronic device including a semiconductor device according to example embodiments.

FIG. 16 is a block diagram illustrating an electronic device including a semiconductor device according to example embodiments.

Referring to FIG. 16, an electronic device 1000 according to an example embodiment may include a communications unit 1010, an input unit 1020, an output unit 1030, a memory 1040, and a processor 1050.

The communication unit 1010 may include a wired/wireless communications module such as a wireless Internet module, a local communications module, a global positioning system (GPS) module, or a mobile communications module. The wired/wireless communications module included in the communications unit 1010 may be connected to an external communications network based on various communications standards to transmit and receive data. The input unit 1020 may include a mechanical switch, a touchscreen, a voice recognition module, and the like, as a module provided for a user to control operations of the electronic device 1000, and may further include various sensor modules to which a user may input data. The output unit 1030 may output information processed by the electronic device 1000 in an audio or video format, and the memory 1040 may store a program for processing or control of the processor 1050, or data. The memory 1040 may include one or more semiconductor devices according to various example embodiments as described above with reference to FIGS. 4 to 13, and may be embedded in the electronic device 1000 or may communicate with the processor 1050 through a separate interface. The processor 1050 may control operations of each component included in the electronic device 1000. The processor 1050 may perform control and processing associated with a voice call, a video call, data communications, and the like, or may conduct control and processing for multimedia reproduction and management. Moreover, the processor 1050 may process the input from a user via the input unit 1020 and output the result thereof through the output unit 1030, and may store data, required for controlling an operation of the electronic device 1000, in the memory 1040 or retrieve the data from the memory 1040.

As set forth above, according to example embodiments of the present inventive concept, due to a bit line sharing structure in which two or more substrate structures are bonded, a semiconductor device with an improved degree of integration may be provided.

Moreover, a method for manufacturing a semiconductor device with improved reliability by forming a bit line sharing structure by bonding two or more substrate structures using a bonding pad.

While example embodiments have been shown and described above, it will be apparent to those skilled in the art that modifications and variations could be made without departing from the scope of the present disclosure, as defined by the appended claims.

What is claimed is:

1. A method for manufacturing a semiconductor device, comprising:

forming a first substrate structure by forming first gate electrodes stacked and spaced apart from each other in a direction perpendicular to a first surface of a first substrate, first channels extending perpendicular to the first substrate while passing through the first gate electrodes, first bit lines connected to the first channels, and first bonding pads disposed on the first bit lines to be electrically connected to the first bit lines, respectively, on the first substrate;

forming a second substrate structure by forming second gate electrodes stacked and spaced apart from each other in a direction perpendicular to a first surface of a second substrate, second channels extending perpendicular to the second substrate while passing through the second gate electrodes, second bit lines connected to the second channels, and second bonding pads disposed on the second bit lines to be electrically connected to the second bit lines, respectively, on the second substrate;

forming a third substrate structure by forming circuit elements on a third substrate, through contact plugs passing through the third substrate to a predetermined depth, and third bonding pads disposed on the circuit elements, on a first surface of the third substrate;

bonding the third substrate structure to the first substrate structure by bonding the first bonding pads to the third bonding pads;

exposing first ends of the through contact plugs by removing a portion of the third substrate from a second surface of the third substrate, opposite the first surface of the third substrate;

forming fourth bonding pads on the through contact plugs, exposed through the second surface of the third substrate; and bonding the second substrate structure to the third substrate structure by bonding the second bonding pads to the fourth bonding pads.

2. The method for manufacturing a semiconductor device of claim 1, wherein the first bit lines are electrically connected to the second bit lines through the first bonding pads, the third bonding pads, the through contact plugs, the fourth bonding pads, and the second bonding pads.

3. The method for manufacturing a semiconductor device of claim 1, wherein:

the forming the first to third substrate structures further includes forming first to fourth dielectric layers surrounding the first to fourth bonding pads, respectively, in the bonding the third substrate structure to the first substrate structure, the first dielectric layer is bonded to the third dielectric layer, and in the bonding the second substrate structure to the third substrate structure, the fourth dielectric layer is bonded to the second dielectric layer.

4. The method for manufacturing a semiconductor device of claim 3, wherein each of the first to fourth dielectric layers is a diffusion prevention layer preventing diffusion of materials of the first to fourth bonding pads.

5. The method for manufacturing a semiconductor device of claim 1, wherein each of the first channels has an inclined side surface narrowing toward the first substrate and each of the second channels has an inclined side surface narrowing toward the second substrate.

6. The method for manufacturing a semiconductor device of claim 1, wherein the first substrate structure and the second substrate structure have a symmetrical structure based on the third substrate structure.

7. The method for manufacturing a semiconductor device of claim 1, wherein the forming the third substrate structure includes:

forming contact holes by removing a portion of the third substrate;

forming a substrate insulating layer on a side wall and a lower surface of the third substrate exposed through the contact holes; and filling the contact holes with a conductive material to form the through contact plugs.

8. The method for manufacturing a semiconductor device of claim 1, wherein the first gate electrodes are electrically connected to the second gate electrodes through the first bonding pads, the third bonding pads, the through contact plugs, the fourth bonding pads, and the second bonding pads.

* * * * *